US011087639B2

(12) United States Patent
Weiss et al.

(10) Patent No.: US 11,087,639 B2
(45) Date of Patent: Aug. 10, 2021

(54) SYSTEMS AND METHODS FOR VEHICLE SIMULATION

(71) Applicant: The Raymond Corporation, Greene, NY (US)

(72) Inventors: Joseph Weiss, Greene, NY (US); Stephen Bentley, Smithville Flats, NY (US); Fernando Goncalves, Vestal, NY (US); Steven Medwin, Binghamton, NY (US); Josh Vanderpool, Windsor, NY (US)

(73) Assignee: The Raymond Corporation, Greene, NY (US)

( * ) Notice: Subject to any disclaimer, the term of this patent is extended or adjusted under 35 U.S.C. 154(b) by 900 days.

(21) Appl. No.: 15/476,039

(22) Filed: Mar. 31, 2017

(65) Prior Publication Data

US 2017/0287357 A1    Oct. 5, 2017

Related U.S. Application Data

(60) Provisional application No. 62/317,755, filed on Apr. 4, 2016.

(51) Int. Cl.
*G09B 19/16* (2006.01)
*G09B 9/042* (2006.01)
(Continued)

(52) U.S. Cl.
CPC .............. *G09B 19/167* (2013.01); *B66F 9/20* (2013.01); *G06F 30/20* (2020.01); *G09B 9/042* (2013.01); *G09B 9/052* (2013.01); *G09B 19/003* (2013.01)

(58) Field of Classification Search
CPC ........ B66F 9/20; G06F 17/5009; G06F 30/20; G09B 19/167; G09B 9/042; G09B 9/052; G09B 19/003
See application file for complete search history.

(56) References Cited

U.S. PATENT DOCUMENTS

| 5,078,608 A * | 1/1992 | Finlay ...................... G09B 9/00 |
| | | 434/219 |
| 5,240,416 A | 8/1993 | Bennington |

(Continued)

FOREIGN PATENT DOCUMENTS

| CN | 201341109 Y | 11/2009 |
| CN | 103442935 A | 12/2013 |

(Continued)

OTHER PUBLICATIONS

Toyota Simulator V2; Jun. 28, 2013; 9 pages.
Extended European Search Report; Appln 17164624.30-1958; dated Jul. 6, 2017; 8 pages.

*Primary Examiner* — Malina D. Blaise
(74) *Attorney, Agent, or Firm* — Quarles & Brady LLP

(57) ABSTRACT

Systems and methods for material handling vehicle simulation are provided. In one aspect, a material handling vehicle simulation system includes a material handling vehicle having a plurality of controls operable to manipulate the material handling vehicle to perform a desired operation, and a vehicle controller configured to selectively transition between a standard mode where the vehicle controller is configured to instruct the vehicle to perform standard operating tasks and a simulation mode. The material handling simulation system further includes a simulation kit having a simulation display, and a simulation controller in communication with the plurality of controls and the simulation display. When the vehicle controller is in the simulation mode, the simulation controller is configured to simulate operation of the material handling vehicle on the simulation display in response to manipulation of at least one of the plurality of controls.

26 Claims, 23 Drawing Sheets

(51) Int. Cl.
*G09B 9/052* (2006.01)
*B66F 9/20* (2006.01)
*G09B 19/00* (2006.01)
*G06F 30/20* (2020.01)

(56) References Cited

U.S. PATENT DOCUMENTS

| | | | |
|---|---|---|---|
| 5,888,069 A | 3/1999 | Romanoff et al. | |
| 6,719,563 B2 | 4/2004 | Donges | |
| 6,856,878 B2 * | 2/2005 | Braunhardt | A01B 63/00 |
| | | | 56/10.2 R |
| 7,021,937 B2 | 4/2006 | Siompson et al. | |
| 7,200,536 B2 | 4/2007 | Wynn | |
| 7,537,522 B2 | 5/2009 | Plavetich et al. | |
| 8,333,592 B2 | 12/2012 | Swan | |
| 8,412,499 B2 | 4/2013 | Sizov | |
| 8,755,965 B1 | 6/2014 | McClintic | |
| 8,777,622 B2 * | 7/2014 | Rauch | G09B 9/042 |
| | | | 434/379 |
| 9,911,359 B2 * | 3/2018 | Wallace | G09B 5/00 |
| 9,994,336 B1 * | 6/2018 | Ghassemieh | B64G 1/00 |
| 2002/0087296 A1 * | 7/2002 | Wynn | G09B 9/042 |
| | | | 703/8 |
| 2004/0040400 A1 | 3/2004 | Pilz | |
| 2004/0129486 A1 * | 7/2004 | Chernoff | B60T 7/08 |
| | | | 180/315 |
| 2004/0129488 A1 * | 7/2004 | Chernoff | B60T 7/02 |
| | | | 180/333 |
| 2005/0202375 A1 * | 9/2005 | Nevo | A61B 5/00 |
| | | | 434/59 |
| 2007/0009862 A1 * | 1/2007 | Quinn | G09B 9/00 |
| | | | 434/38 |
| 2007/0269771 A1 * | 11/2007 | Lefton | G09B 9/14 |
| | | | 434/29 |
| 2007/0287133 A1 * | 12/2007 | Schubert | F41A 33/00 |
| | | | 434/11 |
| 2008/0082372 A1 * | 4/2008 | Burch | G06Q 40/08 |
| | | | 705/4 |
| 2008/0206719 A1 * | 8/2008 | Johnsson | G09B 9/00 |
| | | | 434/37 |
| 2009/0011389 A1 * | 1/2009 | Sizov | A63F 13/08 |
| | | | 434/66 |
| 2009/0125161 A1 * | 5/2009 | Baur | G09B 19/16 |
| | | | 701/1 |
| 2009/0176197 A1 * | 7/2009 | Vogt | G09B 23/12 |
| | | | 434/302 |
| 2010/0145578 A1 * | 6/2010 | Baur | G09B 19/0038 |
| | | | 701/41 |
| 2012/0281002 A1 * | 11/2012 | Ward | G06T 15/30 |
| | | | 345/501 |
| 2012/0301853 A1 * | 11/2012 | Garvis | G09B 9/14 |
| | | | 434/58 |
| 2013/0169514 A1 * | 7/2013 | Edwards | G06F 3/04815 |
| | | | 345/8 |
| 2013/0180744 A1 * | 7/2013 | Favreau | E02F 3/7668 |
| | | | 172/780 |
| 2013/0302760 A1 * | 11/2013 | Welles | G09B 9/052 |
| | | | 434/69 |
| 2013/0302761 A1 * | 11/2013 | Best | G09B 19/167 |
| | | | 434/71 |
| 2014/0377719 A1 | 12/2014 | Johnsson et al. | |
| 2015/0079550 A1 * | 3/2015 | Blansett | G09B 23/12 |
| | | | 434/126 |
| 2015/0190876 A1 | 7/2015 | Becker et al. | |
| 2015/0199458 A1 * | 7/2015 | Bacon | G06F 17/5009 |
| | | | 703/8 |
| 2016/0093230 A1 * | 3/2016 | Boggs | G09B 9/302 |
| | | | 434/38 |
| 2016/0148526 A1 * | 5/2016 | Morris | G09B 9/04 |
| | | | 434/62 |
| 2016/0232814 A1 * | 8/2016 | Smith | G09B 9/042 |
| 2017/0025031 A1 * | 1/2017 | Dreyer | G09B 9/12 |
| 2017/0124225 A1 * | 5/2017 | Humphrey | G06F 30/20 |
| 2017/0131711 A1 * | 5/2017 | Thomson | G06Q 10/06395 |
| 2017/0213474 A1 * | 7/2017 | Welles | G09B 9/052 |

FOREIGN PATENT DOCUMENTS

| | | |
|---|---|---|
| CN | 103580070 A | 2/2014 |
| CN | 104464438 A | 3/2015 |
| CN | 104467153 A | 3/2015 |
| CN | 104517493 A | 4/2015 |
| CN | 104616559 A | 5/2015 |
| CN | 204821033 A | 12/2015 |
| DE | 102014000804 A1 | 7/2013 |
| EP | 1895488 A2 | 5/2008 |
| GB | 2518236 A | 3/2015 |

* cited by examiner

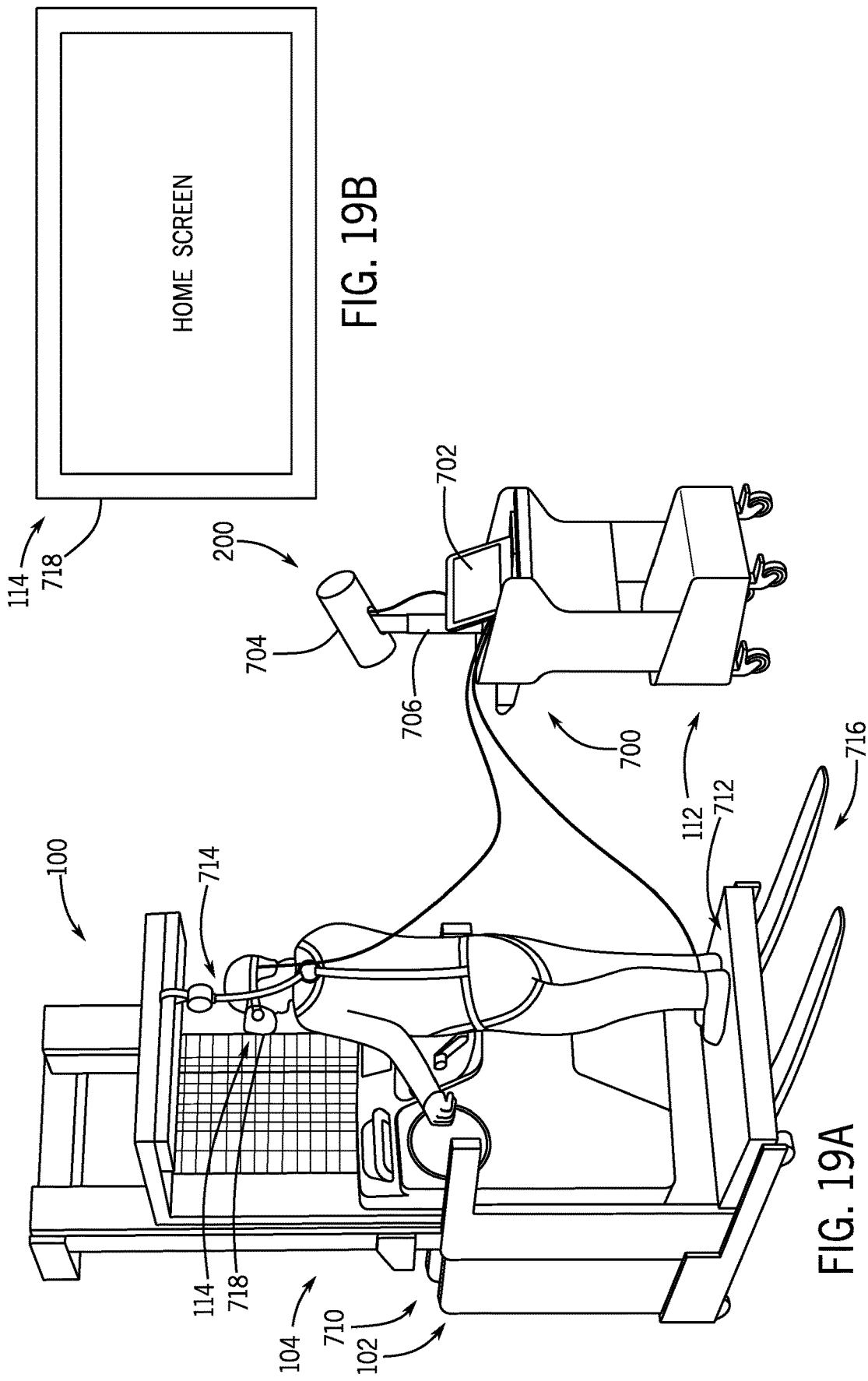

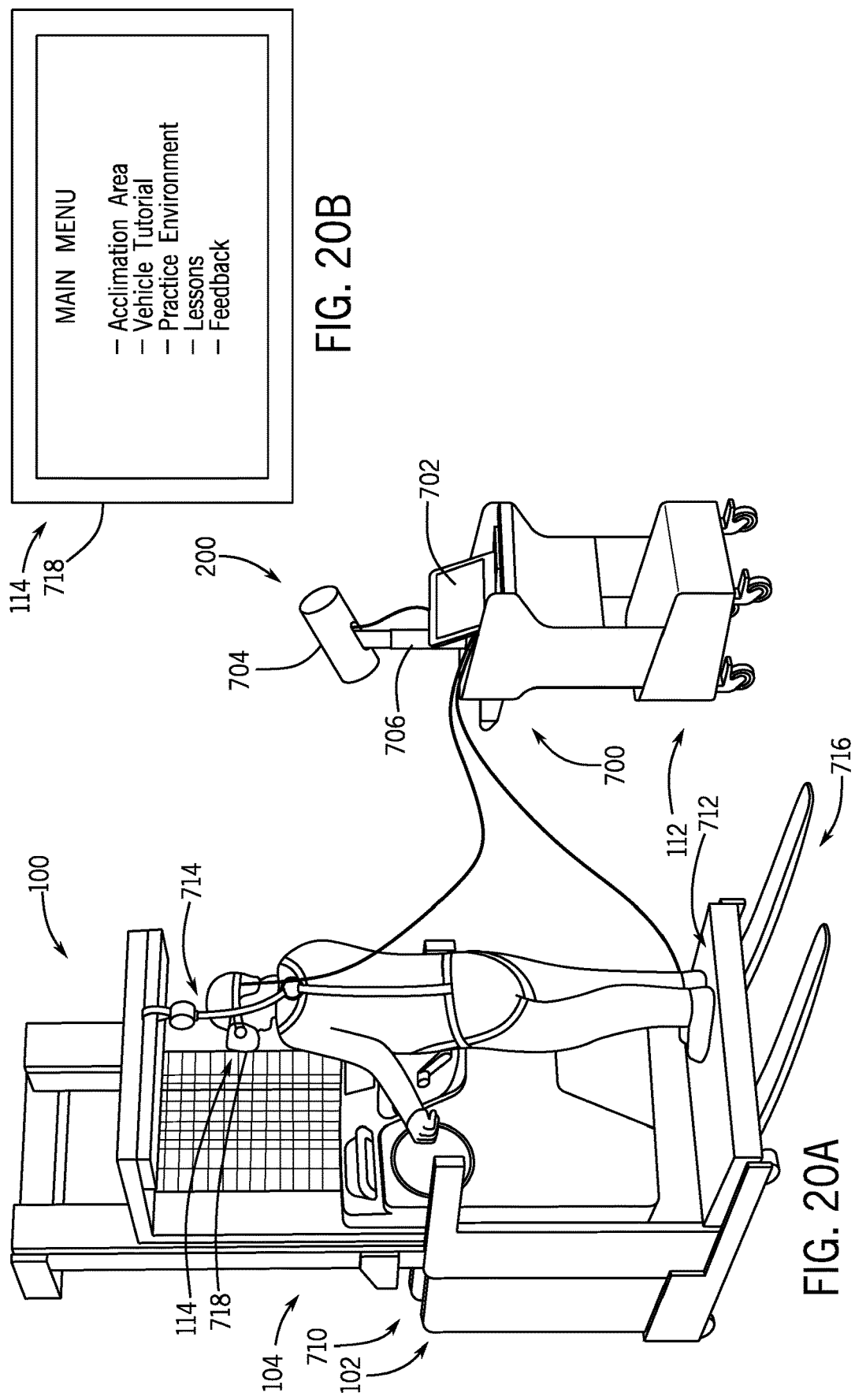

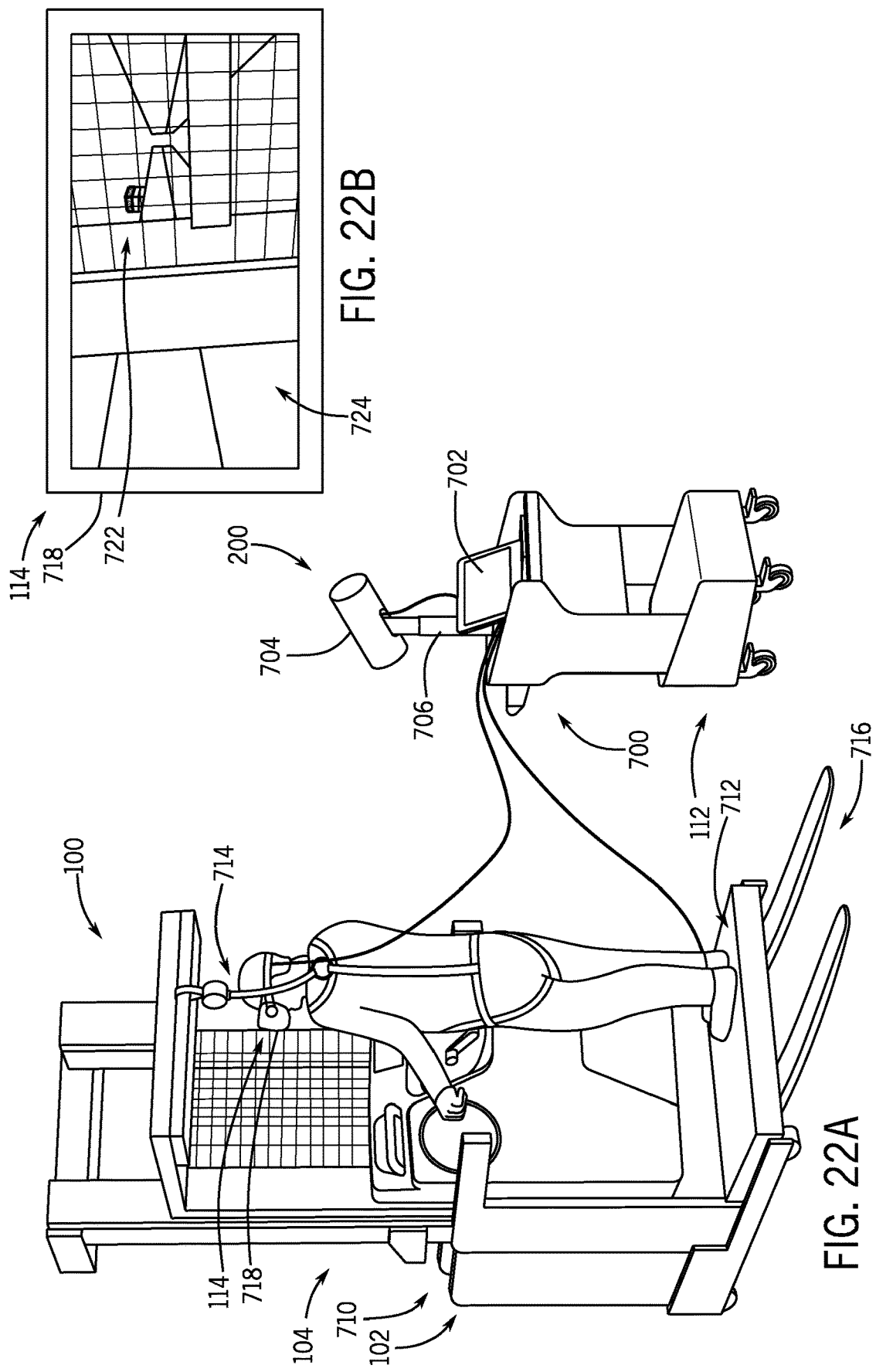

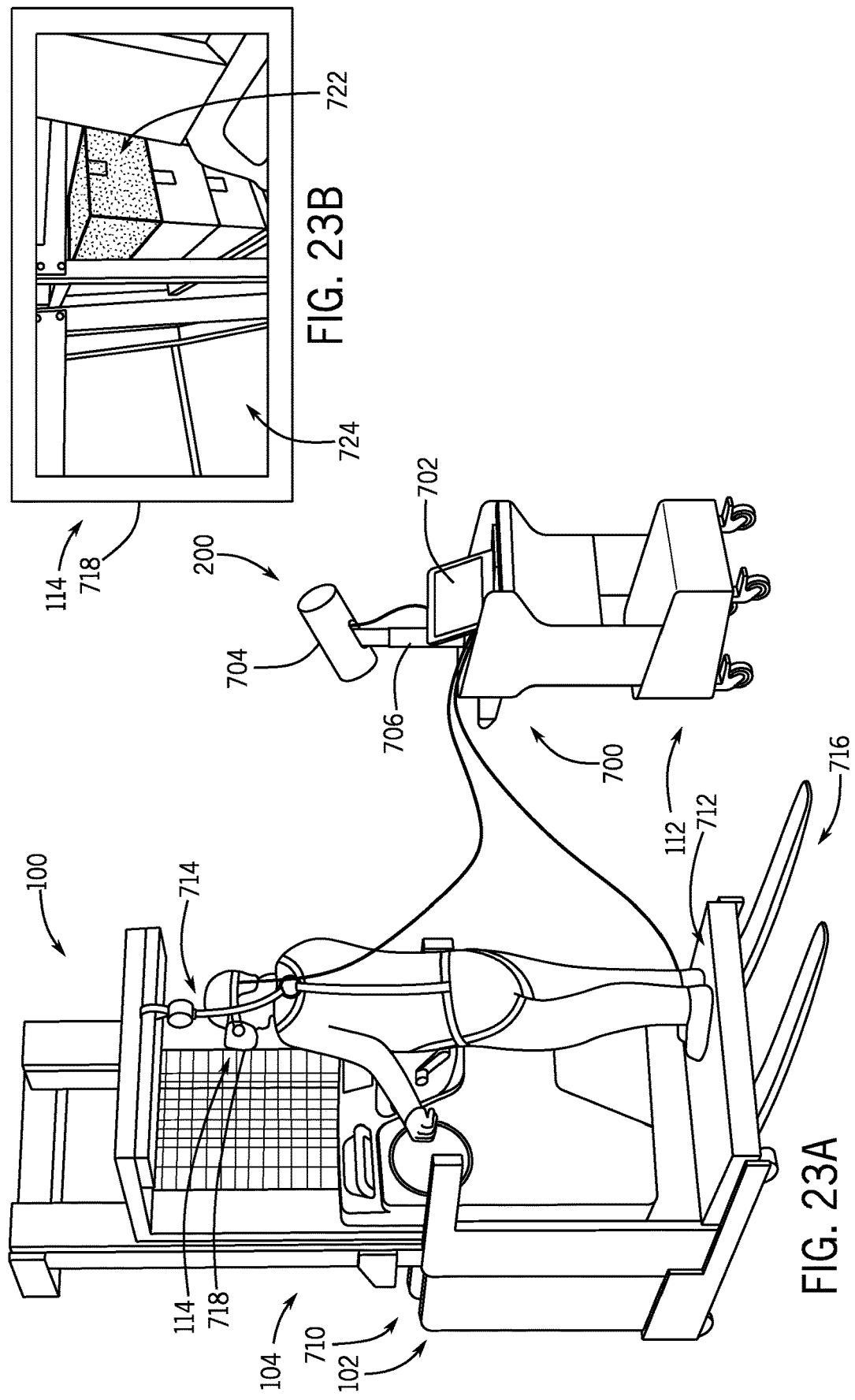

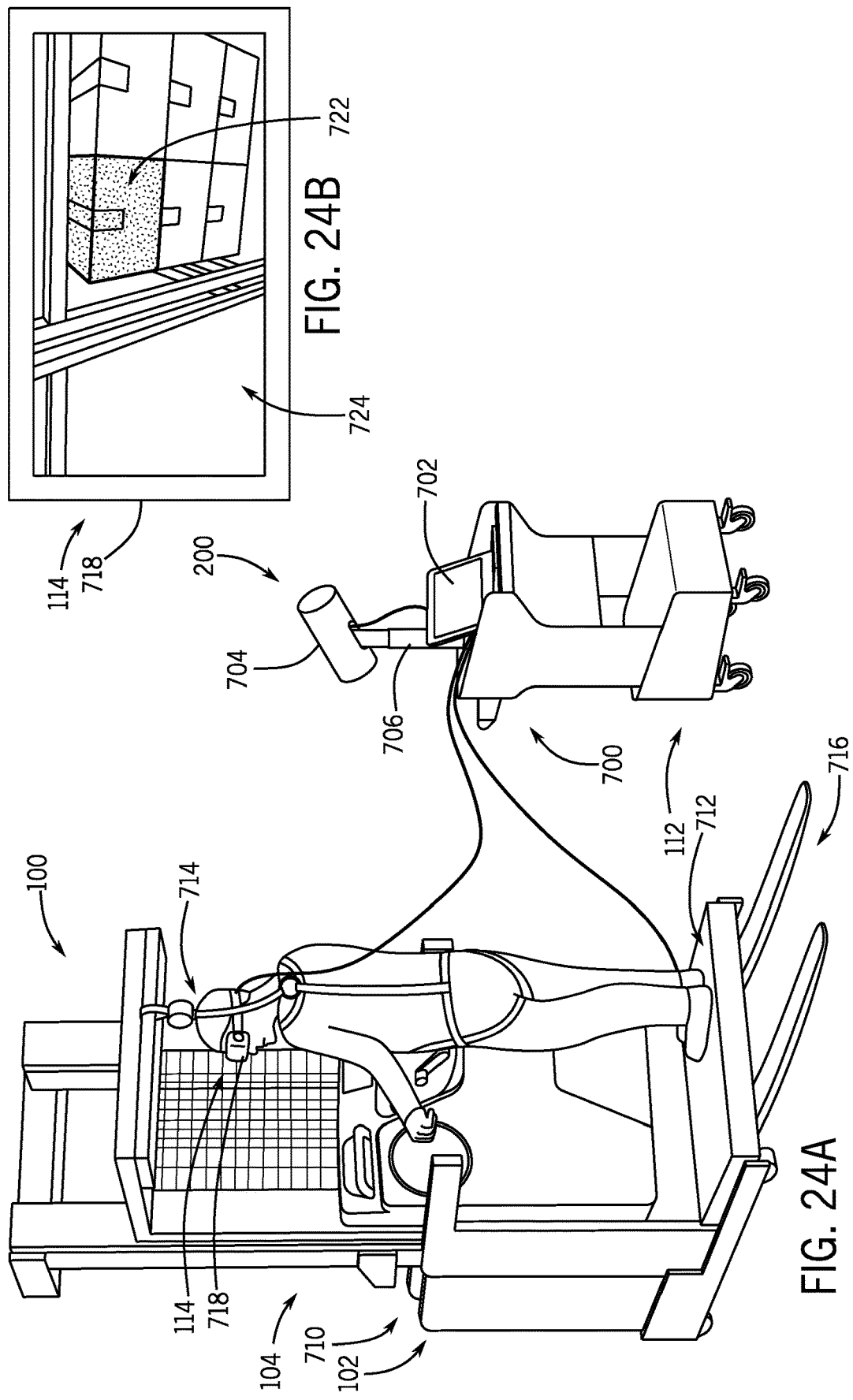

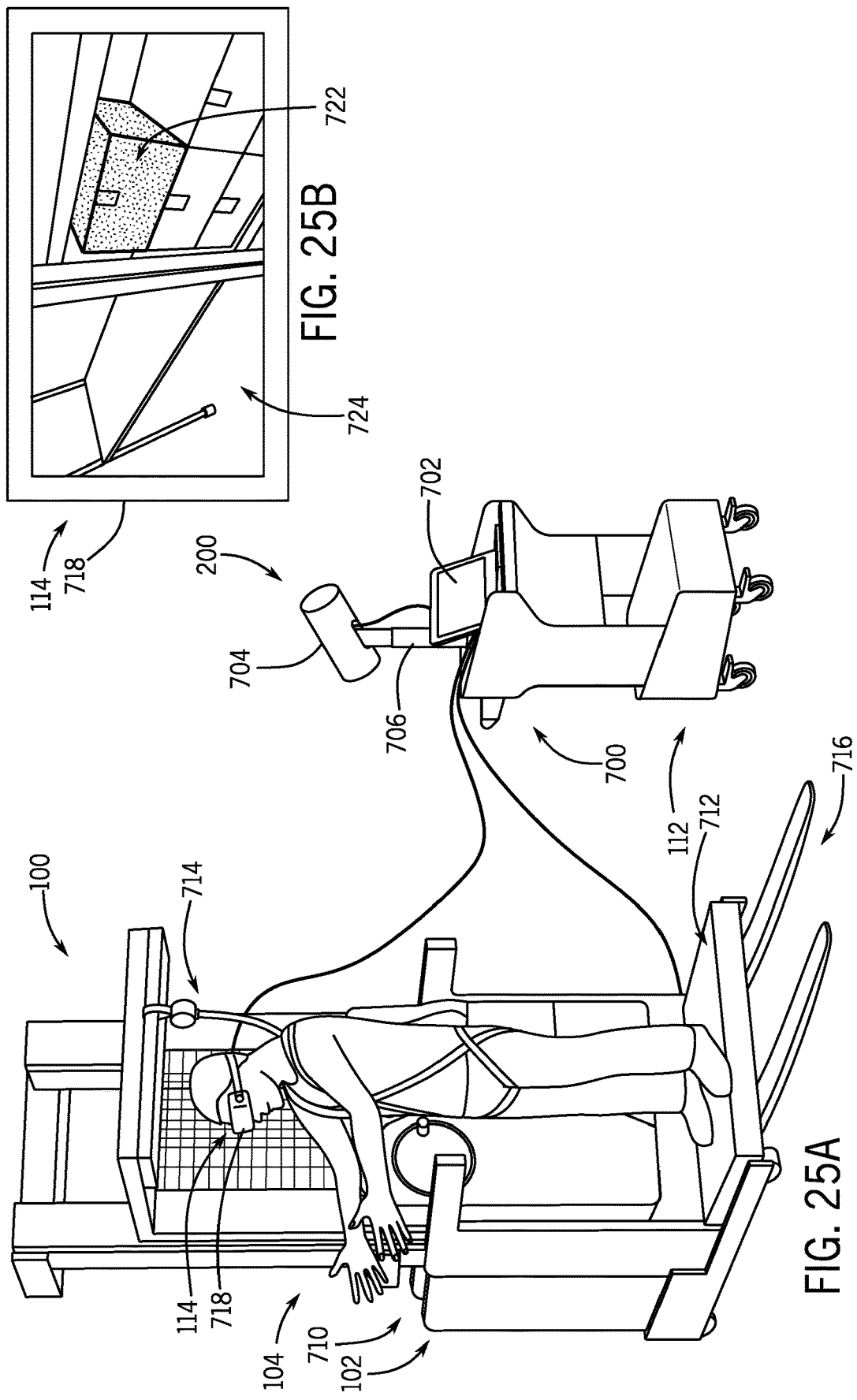

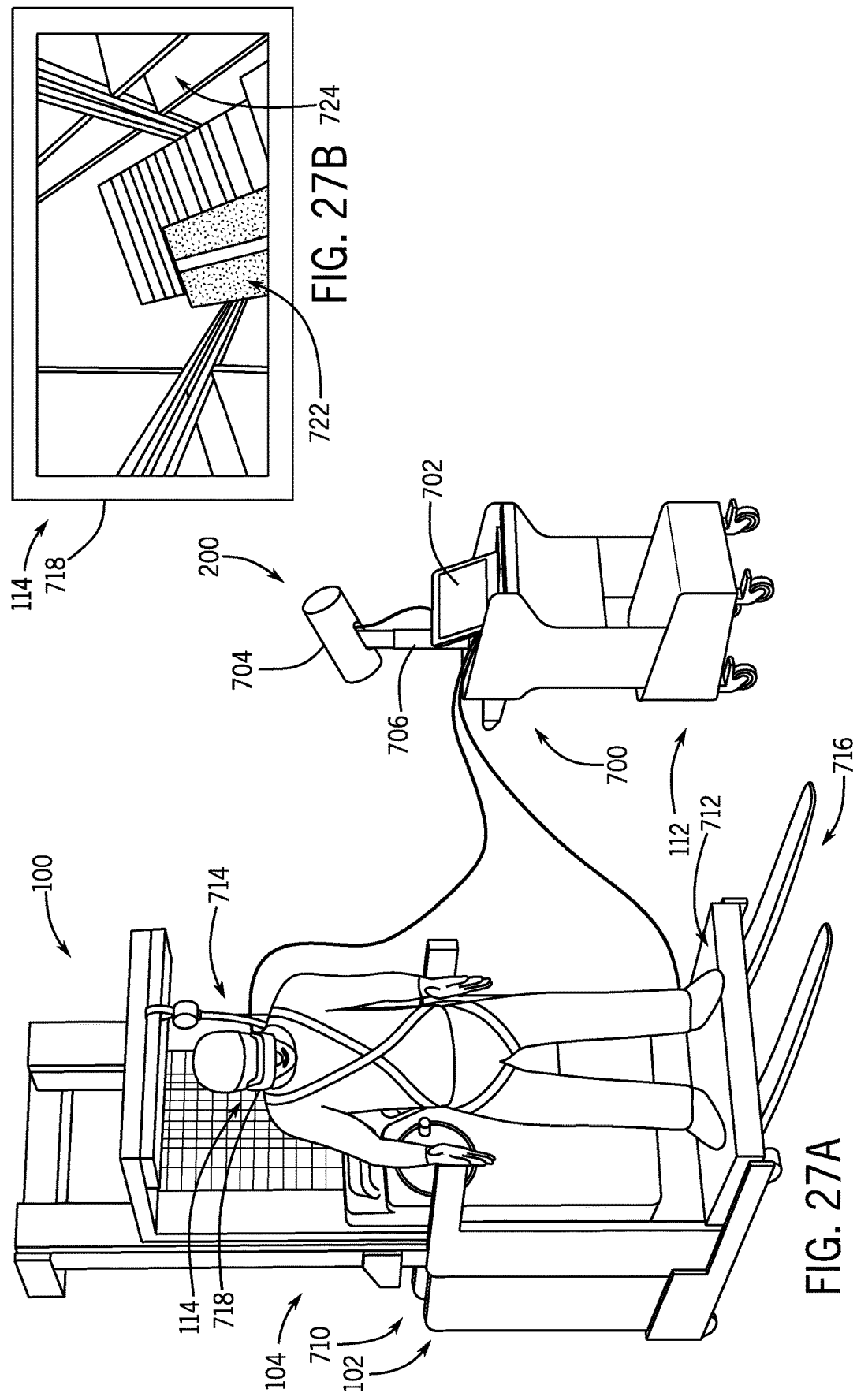

SYSTEMS AND METHODS FOR VEHICLE SIMULATION

CROSS-REFERENCES TO RELATED APPLICATIONS

The present application is based on, claims priority to, and incorporates herein by reference in its entirety, U.S. Provisional Patent Application No. 62/317,755, filed on Apr. 4, 2016, and entitled "Systems and Methods for Vehicle Simulation."

STATEMENT REGARDING FEDERALLY SPONSORED RESEARCH

Not Applicable.

BACKGROUND

The present invention relates generally to vehicle simulation and, more specifically, to systems and methods for converting an operational vehicle into a simulation vehicle.

For certain types of vehicles there are training requirements imposed by various government agencies, laws, rules and regulations. For example, the United States Department of Labor Occupational Safety and Health Administration (OSHA) imposes a duty on employers to train and supervise operators of various types of equipment. There are a variety of methods used to accomplish this training including the use of simulators. Currently, simulators for training vehicle operators can comprise a dedicated simulator (FIG. 1), a computer-based simulator (FIG. 2), and/or training operators on actual vehicles performing actual tasks (i.e., the vehicle is fully operational). Dedicated simulators, as shown in FIG. 1, are typically full-scale replicas of the actual vehicle operator compartment and controls. They can process feedback from the operator controls to create a physics-based simulation of how an actual vehicle would respond under certain conditions and control feedback from the operator. Dedicated simulators can aid in training an operator to use equipment, and can be advantageous for training new operators in situations where performing actual tasks would not be desirable. However, dedicated simulators can present a large cost burden for owners and others with a duty to train their operators, and do not perform any additional functions other than simulation. Thus, the dedicated simulators are only useful as simulators and cannot be repurposed as an operational vehicle when not used as a simulator.

Computer based simulators, as shown in FIG. 2, can be a low-cost alternative where operators can control a representation of a vehicle through simplified controls. However, these simulators are less representative of the actual vehicle controls, for example, using a game controller. Trainees can learn basic vehicle responses, but this is often less valuable than a dedicated simulator as the tactile control feedback from the vehicle controls are not representative of actual vehicle controls.

When training new operators using actual vehicles, new operators drive the vehicle in a supervised and controlled environment to practice maneuvers, gaining experience and confidence. However, using actual vehicles requires a trainer to oversee the trainee.

SUMMARY OF THE INVENTION

The aforementioned shortcomings of current simulation methods can be overcome by providing systems and methods for converting an operational vehicle into a simulation vehicle. Such systems and methods may eliminate the need for end users to purchase an expensive dedicated simulator, enable vehicles already in use to double as simulators, and provide a simulation environment where the operator can learn on an actual vehicle.

In one aspect, the present disclosure provides, a material handling vehicle simulation system comprising a material handling vehicle including a plurality of controls operable to manipulate the material handling vehicle to perform a desired operation, and a vehicle controller configured to selectively transition between a standard mode where the vehicle controller is configured to instruct the material handling vehicle to perform standard operating tasks and a simulation mode. The material handling simulation system further includes a simulation kit having a simulation display, and a simulation controller in communication with the plurality of controls and the simulation display. When the vehicle controller is in the simulation mode, the simulation controller is configured to simulate operation of the material handling vehicle on the simulation display in response to manipulation of at least one of the plurality of controls.

In some aspects, the vehicle controller is further configured to detect a triggering event to indicate when the vehicle controller is to transition between the standard mode and the simulation mode.

In some aspects, the triggering event comprises connecting the simulation controller to the vehicle controller.

In some aspects, the triggering event comprises actuating a switch.

In some aspects, the triggering event comprises connecting the simulation controller to the vehicle controller followed by actuating a switch.

In some aspects, the simulation kit further comprises a performance capture device in communication with the simulation controller and configured to monitor a position of at least a portion of an operator.

In some aspects, the performance capture device is in the form of a camera.

In some aspects, the performance capture device is in the form of an infrared sensor.

In some aspects, the vehicle controller is configured to communicate output signals from the plurality of controls to the simulation controller.

In some aspects, the vehicle further comprises a simulation port in communication with the vehicle controller.

In some aspects, a connection between the vehicle controller and the simulation controller via the simulation port is configured to trigger the vehicle controller to transition to the simulation mode.

In some aspects, the material handling vehicle includes at least one component configured to provide haptic feedback to an operator, when the vehicle controller is in the simulation mode.

In some aspects, the simulation display comprises virtual reality goggles.

In some aspects, the simulation controller is configured to alter a camera angle and a simulated position displayed by virtual reality goggles based on a position of an operator, when the vehicle controller is in the simulation mode.

In some aspects, the simulation controller is integrated into a simulation kiosk.

In some aspects, the simulation kiosk includes a kiosk display configured to reflect the simulation display.

In some aspects, the simulation kiosk includes a performance capture device in communication with the simulation controller and configured to monitor a position of at least a portion of an operator.

In one aspect, the present disclosure provides, a simulation kit configured to interact with a material handling vehicle having a vehicle controller, a simulation port in communication with the vehicle controller, and a plurality of controls in communication with the vehicle controller. The simulation kit includes a simulation display, a performance capture device configured to monitor a position of at least a portion of an operator positioned within the material handling vehicle, and a simulation controller configured to connect to the vehicle controller via the simulation port. When the simulation controller is connected to the simulation port, the simulation controller is configured to generate a simulated environment that is projected onto the simulation display, and the simulation controller is configured to adapt the simulated environment in response to manipulation of at least one of the plurality of controls.

In some aspects, the performance capture device is in the form of a camera.

In some aspects, the performance capture device is in the form of an infrared sensor.

In some aspects, the connection between the vehicle controller and the simulation controller via the simulation port is configured to trigger the vehicle controller to transition to from a standard mode to a simulation mode.

In some aspects, the simulation display comprises virtual reality goggles.

In some aspects, the simulation controller is configured to alter a camera angle and a simulated position displayed by virtual reality goggles in the simulated environment based on a position of an operator monitored by the performance capture device.

In some aspects, the simulation controller is integrated into a simulation kiosk.

In some aspects, the simulation kiosk includes a kiosk display configured to reflect the simulation display.

In some aspects, the performance capture device is coupled to the simulation kiosk.

In one aspect, the present disclosure provides a method for material handling vehicle simulation using a material handling vehicle. The material handling vehicle includes a plurality of controls and a simulation port. The material handling vehicle is operable in a standard mode where the material handling vehicle is configured to perform standard operating tasks and a simulation mode. The method includes connecting a simulation controller to the simulation port, the simulation controller in communication with a simulation display, triggering the material handling vehicle to transition from the standard mode to the simulation mode, and simulating operation of the material handling vehicle in a simulated environment on the simulation display in response to an operator manipulating at least one of the plurality of controls.

In some aspects, triggering the vehicle to transition from the standard mode to the simulation mode comprises detecting the connection between the simulation controller and the simulation port on the material handling vehicle.

In some aspects, the method further comprises providing a message from the simulation controller to the vehicle controller requesting confirmation that the material handling vehicle is to be placed into the simulation mode.

In some aspects, the method further comprises indicating, in response to the provided message, that the material handling vehicle is to transition into the simulation mode and upon indicating that the material handling vehicle is to transition to the simulation mode, transitioning the material handling vehicle from the standard mode to the simulation mode.

In some aspects, the method further comprises communicating information relating to a type and operational capabilities of the material handling vehicle from the vehicle controller to the simulation controller.

In one aspect, the present disclosure provides a material handling vehicle simulation system comprising a material handling vehicle including a plurality of controls operable to manipulate the material handling vehicle to perform a desired operation, a simulation port, and a vehicle controller in communication with the plurality of controls and the simulation port. The vehicle controller is configured to selectively transition between a standard mode where the vehicle controller is configured to instruct the vehicle to perform standard operating tasks and a simulation mode. The material handling simulation system further includes a simulation kit having a simulation display, an AC to DC converter, and a simulation controller in communication with the simulation display and the plurality of controls. When the vehicle controller is in the simulation mode, the plurality of controls and the vehicle controller are configured to receive power from the AC to DC converter.

In some aspects, the AC to DC converter is configured to receive power from a power supply independent from a vehicle battery.

In some aspects, the material handling simulation system further includes an inline fuse in electrical connection with the AC to DC converter and a vehicle motor.

In some aspects the fuse is configured to prevent the vehicle motor from drawing a current greater than a predetermined simulation value from the power supply.

In some aspects the simulation port further comprises a primary circuit and a redundant circuit.

In some aspects, the vehicle controller is configured to confirm that the redundant circuit and the primary circuit are simultaneously one of open or closed prior to instructing the vehicle to perform one of the standard operating tasks or the simulation mode.

The foregoing and other aspects and advantages of the invention will appear from the following description. In the description, reference is made to the accompanying drawings which form a part hereof, and in which there is shown by way of illustration a preferred embodiment of the invention. Such embodiment does not necessarily represent the full scope of the invention, however, and reference is made therefore to the claims and herein for interpreting the scope of the invention.

DESCRIPTION OF DRAWINGS

The invention will be better understood and features, aspects and advantages other than those set forth above will become apparent when consideration is given to the following detailed description thereof. Such detailed description makes reference to the following drawings.

FIG. 19A illustrates a material handling vehicle configured to operate with the simulation kit of FIG. 13.

FIG. 19B illustrates a home screen projected in a simulated environment of the simulation kit of FIG. 13.

FIG. 20A illustrates an operator utilizing the simulation kit of FIG. 13 to navigate through a main menu.

FIG. 20B illustrates a main menu projected in a simulated environment of the simulation kit of FIG. 13.

FIG. 22A illustrates an operator manipulating a material handling vehicle to initially travel through a simulated environment of the simulation kit of FIG. 13.

FIG. 22B illustrates a simulated view of an operator traveling on a material handling vehicle projected by the simulation kit of FIG. 13.

FIG. 23A illustrates an operator manipulating a material handling vehicle to travel toward a simulated desired load in a simulated environment of the simulation kit of FIG. 13.

FIG. 23B illustrates a simulated view of an operator approaching a simulated desired load on a simulated racking structure projected by the simulation kit of FIG. 13.

FIG. 24A illustrates an operator manipulating a material handling vehicle turning toward a simulated desired load that is generated in a simulated environment of the simulation kit of FIG. 13.

FIG. 24B illustrates a simulated view of an operator turning toward a simulated desired load on a simulated racking structure projected by the simulation kit of FIG. 13.

FIG. 25A illustrates an operator on a material handling vehicle reaching toward a simulated desired load that is generated in a simulated environment of the simulation kit of FIG. 13.

FIG. 25B illustrates a simulated view of an operator reaching toward a simulated desired load on a simulated racking structure projected by the simulation kit of FIG. 13.

FIG. 27A illustrates an operator on a material handling vehicle placing a simulated desired load that is generated in a simulated environment of the simulation kit of FIG. 13.

FIG. 27B illustrates a simulated view of an operator placing a simulated desired load on a simulated material handling vehicle projected by the simulation kit of FIG. 13.

DETAILED DESCRIPTION OF THE INVENTION

Figure 1:
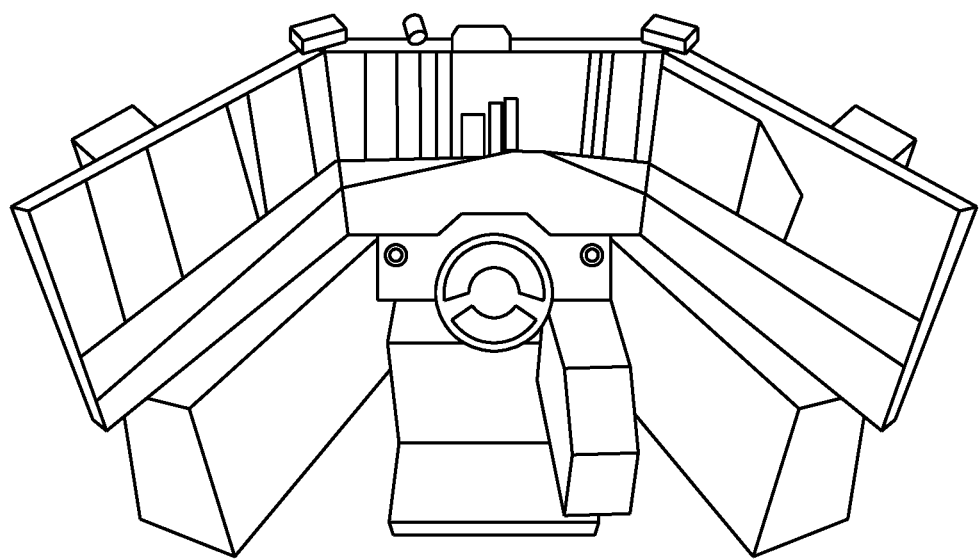
FIG. 1 is an illustration of a dedicated simulator known in the art.
Figure 2:
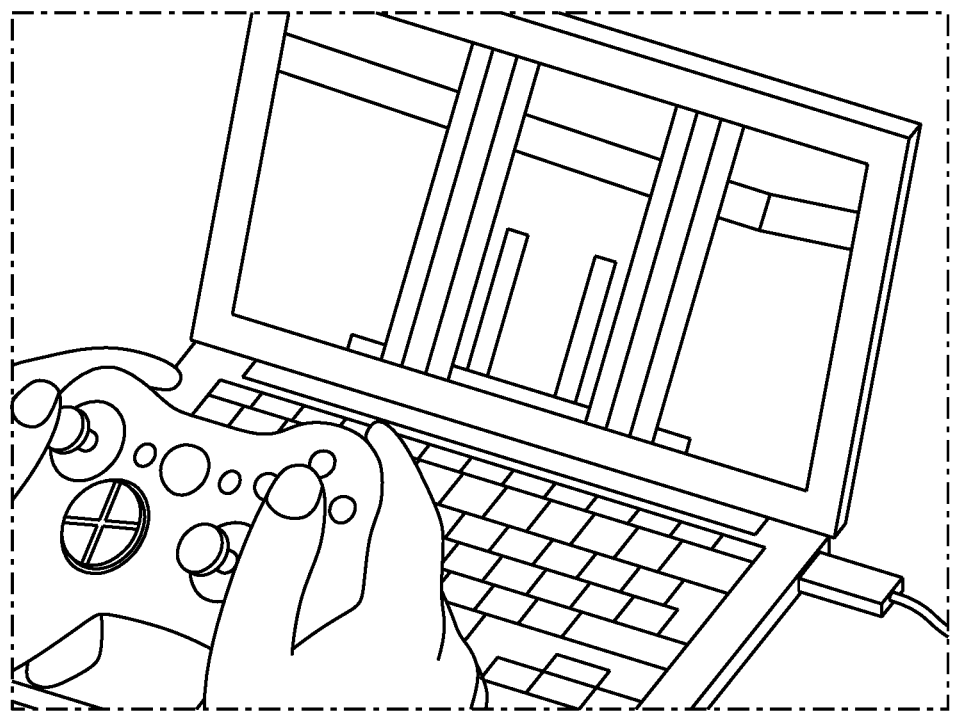
FIG. 2 is an illustration of a computer based simulator known in the art.
Figure 3:
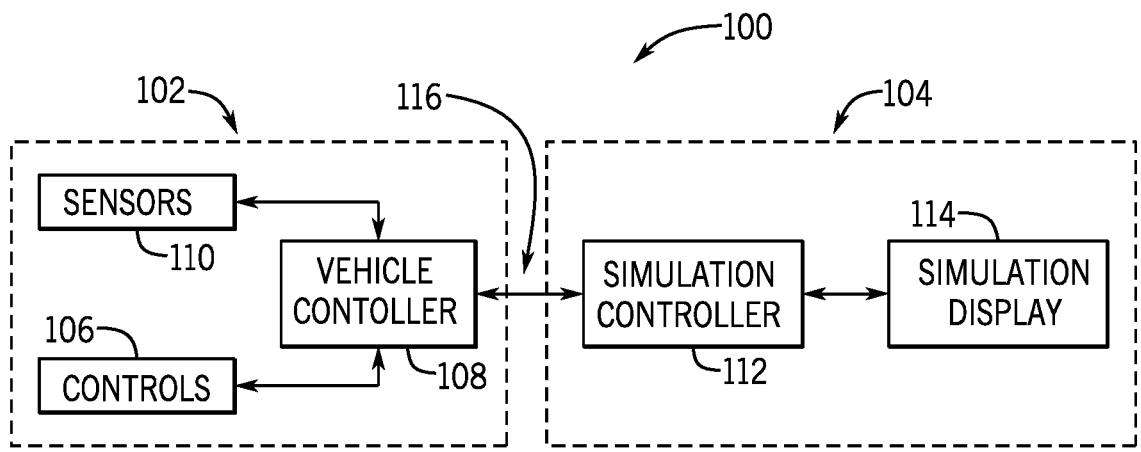
FIG. 3 is a schematic illustration of a vehicle simulation system with a simulation controller in communication with a vehicle controller according to one aspect of the present disclosure.

FIG. 3 shows one non-limiting example of a vehicle simulation system 100 according to the present disclosure. The vehicle simulation system 100 can include a vehicle 102 and a simulation kit 104. In some non-limiting examples, the vehicle 102 can be a material handling vehicle (e.g., order picker, reach vehicle, SWING-REACH® lift truck).

The vehicle 102 can include a plurality of controls 106 each configured to manipulate the vehicle 102 to perform a desired operation. That is, each of the plurality of controls 106 can be configured to control a component on the vehicle 102 that, in some form, manipulates the vehicle 102. For example, the plurality of controls 106 can include steering control, speed control, fork control, mast control, brake control, and horn control, to name a few. In some non-limiting examples, some of the plurality of controls 106 may be in the form of a joy stick or a steering wheel. In other non-limiting examples, some of the plurality of controls 106 may be in the form of a push-button or a switch. In any case, each of the plurality of controls 106 can be manually manipulated by an operator of the vehicle 102 to perform a desired operation (e.g., drive/steer, position forks to pick up a load, etc.).

Each of the plurality of controls 106 can be in communication with a vehicle controller 108 and configured to output a signal to the vehicle controller 108 proportional to a degree of manipulation of the respective control 106. Some output signals may be discrete signals. In some cases, the vehicle controller 108 can be configured to instruct a corresponding component to manipulate the vehicle 102 proportional to the output signal from one or more of the plurality of controls 106. For example, one of the plurality controls 106 can output a signal to the vehicle controller 108 proportional to a desired speed of the vehicle 102, requested by the operator, and the vehicle controller 108 can in turn instruct a motor to move the vehicle 102 at the desired speed. In other cases, the vehicle controller 108 can read the output signal from one or more of the plurality of controls 106 and the vehicle controller 108 may not be required to instruct an additional component. For example, one of the plurality of controls 106 can output a signal to the vehicle controller 108 proportional to a desired angle, or degree, of steering of the vehicle 102, requested by the operator, and, since the steering may be mechanically transferred to wheels of the vehicle 102 by the operator, the vehicle controller 108 may not be required to instruct an additional component to turn the wheels.

The vehicle 102 can include a plurality of sensors 110 configured to monitor operating characteristics of the vehicle 102 (e.g., temperatures, pressures, speed, direction, detect surrounding objects, etc.). Each of the plurality of sensors 110 can be in communication with the vehicle controller 108. The vehicle controller 108 can be configured to read the quantities measured or discrete signals produced by the plurality of sensors 110 and, for example, alert an operator, via a visual and/or audible indicator, if one or more of the plurality of sensors 110 measures a quantity that is outside a predetermined range, or above or below a predefined set point.

The simulation kit 104 can include a simulation controller 112 and a simulation display 114. The simulation controller 112 can be in communication with the vehicle controller 108 and the simulation display 114. The simulation controller 112 and/or the simulation display 114 can receive input power from an external source (e.g., AC wall source or a DC power supply) or, in some non-limiting examples, the simulation controller 112 and/or the simulation display 114 can receive power from an energy source on the vehicle 102 (e.g., battery, fuel cell, motor, etc.) In one non-limiting example, the simulation controller 112 may be connected to a simulation port 116 of the vehicle 102. In other non-limiting examples, the simulation controller 112 may be in wireless communication with the vehicle controller 108, for example, via Bluetooth®, WiFi, or any other wireless communication protocol known in the art or developed in the future.

In operation, the vehicle controller 108 can be configured to control the operation of the vehicle 102, and can be operable in a standard mode and a simulation mode. In the standard mode, the vehicle controller 108 can be configured to instruct the vehicle 102 to perform standard operating tasks (e.g., traveling to a load and carrying the load to a desired location) based on inputs to the plurality of controls 106 from an operator. That is, in the standard mode, an operator can manipulate the plurality of controls 106 to operate the vehicle 102 as intended by the vehicle manufacturer. In the simulation mode, the vehicle controller 108 can be configured to prevent the vehicle 102 from actuating and/or translating a selective group of vehicle components, but can read the output signals from the plurality of controls 106 in response to manipulation by an operator. Thus, in the simulation mode, the plurality of controls 106 can output a signal to the vehicle controller 108 proportional to a degree of manipulation, however, the manipulation of the plurality of controls 106 may not result in mechanical movement of the vehicle 102. In some non-limiting examples, the vehicle 102 may be prevented from travel along a surface when in the simulation mode. In some non-limiting examples, the vehicle 102 may be configured to maintain all components active that do not result in physical translation of the vehicle 102 (e.g., forks, mast, horn, lights, etc.). In these non-limiting examples, haptic feedback may be provided to an operator in the simulation mode to provide an interactive, real-life simulation experience.

Figure 4:
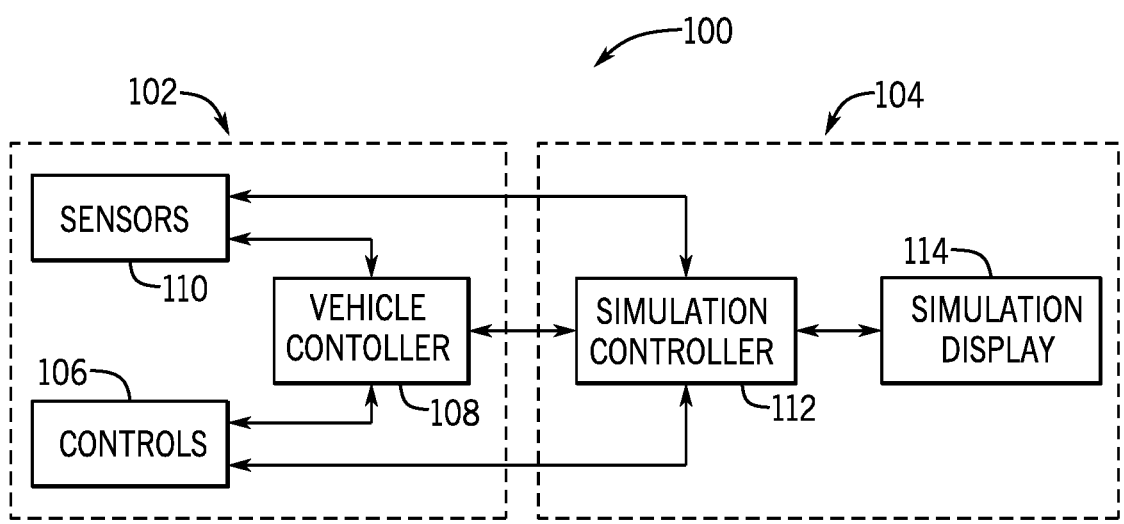
FIG. 4 is a schematic illustration of a vehicle simulation system with a simulation controller in communication with sensors and controls of a vehicle according to one aspect of the present disclosure.

FIG. 4 shows another non-limiting example of the vehicle simulation system 100. The vehicle simulation system 100 of FIG. 4 can be similar to the vehicle simulation system 100 of FIG. 3, with similar features identified using like reference numerals, except as described below or is apparent in FIG. 4. As shown in FIG. 4, the simulation controller 112 can be in communication with the plurality of controls 106 and the plurality sensors 110 in the vehicle simulation system 100. In this non-limiting example, the vehicle controller 108 may not include the simulation port 116, as the simulation controller 112 can be configured to directly read the signals from the plurality of controls 106 and the plurality of sensors 110. In this non-limiting example, the simulation controller 112 can be removably connected to the plurality of controls 106 and the plurality of sensors 110.

Figure 5:
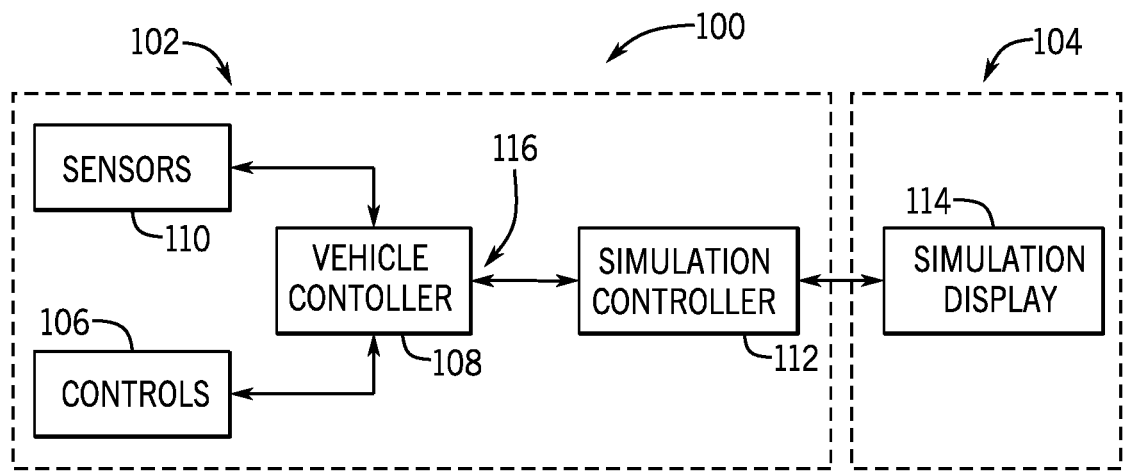
FIG. 5 is a schematic illustration of a vehicle simulation system with a simulation controller integrated into a vehicle according to one aspect of the present disclosure.
Figure 6:
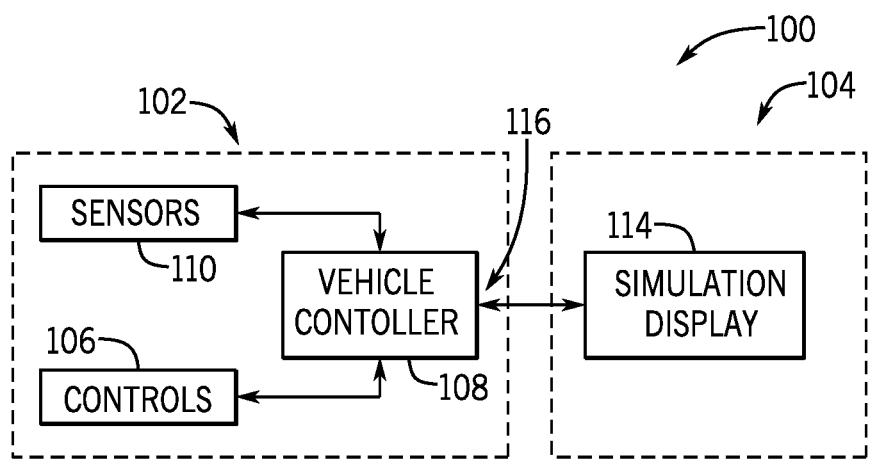
FIG. 6 is a schematic illustration of a vehicle simulation system where a vehicle controller facilitate simulation according to one aspect of the present disclosure.

In one non-limiting example, as shown in FIG. 5, the simulation controller 112 can be located on-board the vehicle 102. In this non-limiting example, the simulation display 114 may be located remotely from the vehicle 102 or on-board the vehicle 102. In another non-limiting example, as shown in FIG. 6, the vehicle controller 108 can be configured to perform the functions of the simulation controller 112. That is, the vehicle controller 108 may be configured to provide sufficient computing power to both operate the vehicle 102 and perform the necessary simulation computations. In this non-limiting embodiment, the simulation controller 112 may not be needed to use the vehicle simulation system 100. In another non-limiting example, the simulation controller 112 can be used to remotely control the vehicle simulation system 100. In this non-limiting example, the simulation controller 112 can utilize cloud-based data. That is, the simulation controller 112 may be a cloud-based application that communicates wirelessly with the vehicle controller 108 to gather the necessary information to carry out the simulation. Alternatively, the simulation controller 112 can utilize other types of wireless data transfer other that cloud-based systems.

Figure 7:
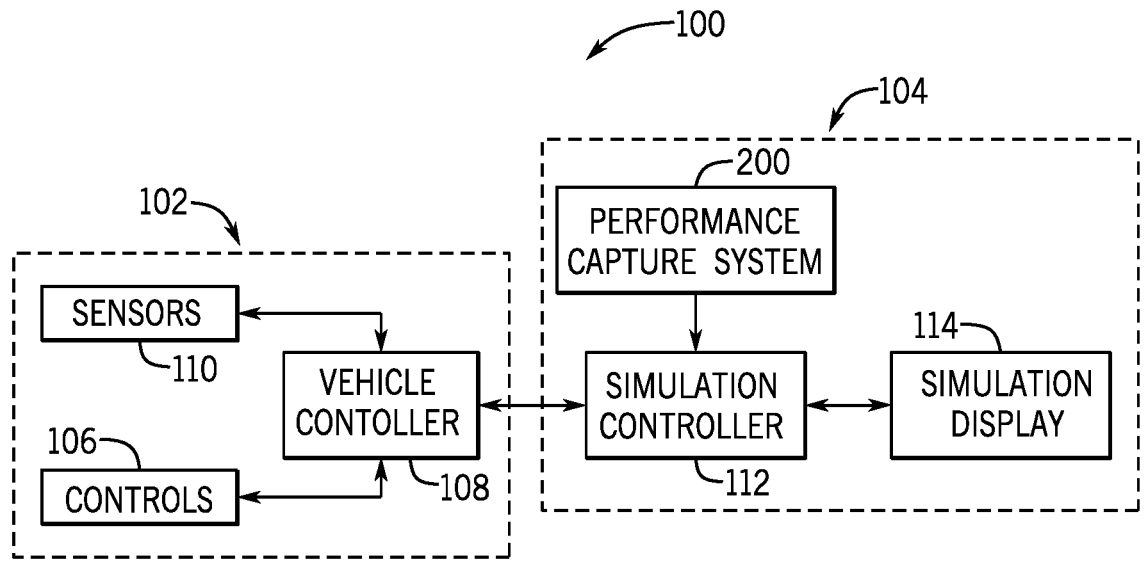
FIG. 7 is a schematic illustration of a vehicle simulation system including a performance capture device according to one aspect of the present disclosure.
Figure 8:
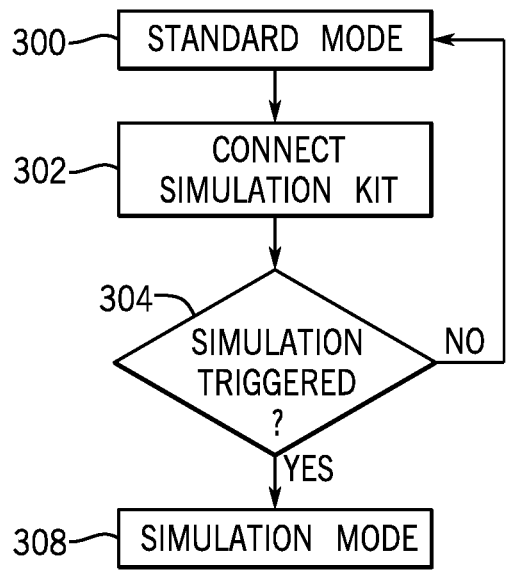
FIG. 8 is a flow chart outlining steps for operating a vehicle simulation system according to one aspect of the present disclosure.

FIG. 7 shows another non-limiting example of the vehicle simulation system 100. As shown in FIG. 7, the simulation kit 104 can include a performance capture device 200 in communication with the simulation controller 112. In one non-limiting example, the performance capture device 200 can be in the form of a time of flight sensor. In another non-limiting example, the performance capture device 200 can be a motion sensor, a gyroscope, and/or a video camera. When activated in the vehicle simulation system 100, the performance capture device 200 can be configured to provide feedback to reinforce the need for the operator to assume and maintain a proper operator position within the vehicle 102. Alternatively or additionally, the performance capture device 200 can be configured to selectively or continuously monitor a position of an operator on the vehicle 102 in the simulation mode. In this way, motions performed by the operator in the simulation mode may be monitored and communicated to the simulation controller 112.

Operation of the vehicle simulation system 100 will be described with reference to FIGS. 3-9 by way of various non-limiting examples. With specific reference to FIG. 8, initially, at step 300, the vehicle 102 can be operating in the standard mode where the vehicle controller 108 can be configured to instruct the vehicle 102 to perform standard operating tasks based on inputs to the plurality of controls 106 from an operator or external management system. The vehicle 102 can be transitioned for use as a simulator by connecting the simulation kit 104 to the vehicle 102 at step 302. In one non-limiting example, when the simulation kit 104 is connected to the vehicle 102, the simulation controller 112 can be connected to the vehicle controller 108 via the simulation port 116. In another non-limiting example, when the simulation kit 104 is connected to the vehicle 102, the simulation controller 112 may be wirelessly connected to the vehicle controller 108. In other non-limiting examples, when the simulation kit 104 is connected to the vehicle 102, the simulation controller 112 may be connected to the plurality of sensors 110 and the plurality of controls 106 on the vehicle 102.

Figure 9:
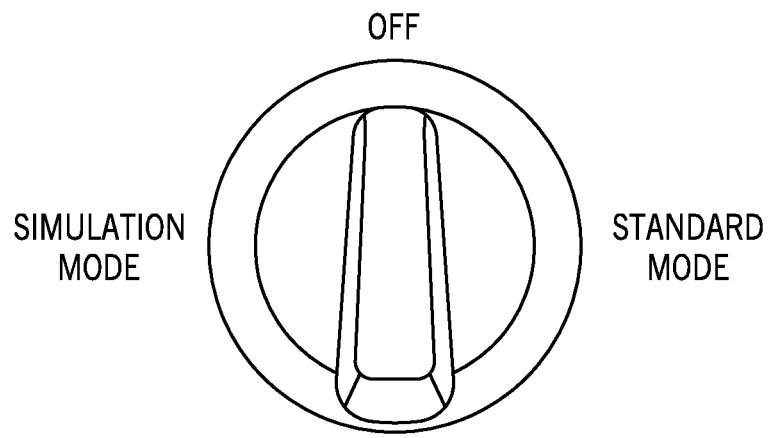
FIG. 9 illustrates a triggering device according to one aspect of the present disclosure.

Once the simulation kit 104 is connected to the vehicle 102, the vehicle controller 108 can determine at step 304 whether a triggering event has triggered the simulation mode and caused the vehicle controller 108 to switch from the standard mode to the simulation mode. In one non-limiting example, the act of connecting the simulation kit 104 to the vehicle 102 can trigger the vehicle controller 108 to trigger the simulation mode. In another non-limiting example, the vehicle 102 may include a switch, as shown in FIG. 9, which enables the vehicle controller 108 to trigger the simulation mode. In this non-limiting example, the actuation of the switch alone may be sufficient to trigger the simulation mode, or the combination of connecting the simulation kit 104 to the vehicle 102 and actuation of the switch may be sufficient to trigger the simulation mode. In some non-limiting examples, the switch may be a key operated switch and a key may be required to turn the switch. In other non-limiting examples, the switch may be a soft switch on a touch screen interface on the vehicle 102, or on the simulation kit 104.

If the vehicle controller 108 determines at step 304 that the simulation mode has not been triggered, then the vehicle controller 108 can remain in the standard mode at step 300. If the vehicle controller 108 determines that the vehicle controller 108 has been triggered at step 304, then the vehicle controller 108 can switch from the standard mode to the simulation mode at step 306. Once the vehicle controller 108 is in the simulation mode at step 306, the vehicle controller 108 can be configured to prevent the vehicle 102 from actuating and/or translating vehicle components but can continue to read the output signals from the plurality of controls 106 and the plurality of sensors 110 in response to manipulation by a trainee. Additionally, certain components of the vehicle 102, which do not result in mechanical movement (e.g., a horn, lights, etc.), may remain active. In some non-limiting examples, the vehicle 102 may be in the form of a material handling vehicle and include forks moveably arranged thereon. In this non-limiting example, the forks located on the vehicle 102 may be able to move in the simulation mode to provide haptic feedback to a trainee (e.g., vibration). In one non-limiting example, the output signals from the plurality of controls 106 and the plurality of sensors 110 may be communicated from the vehicle controller 108 to the simulation controller 112 (e.g., the simulation controller 112 can be in communication with a CAN bus on the vehicle 102). In another non-limiting example, the output signals from the plurality of controls 106 and the plurality of sensors 110 may be directly read by the simulation controller 112. In either case, the simulation controller 112 can use the output signals from the plurality of controls 106 and the plurality of sensors 110 to represent a physics-based model of the vehicle 102 in a simulation environment. In another non-limiting example, sensors on the vehicle can capture data that can be utilized in constructing the simulation environment. In one non-limiting example, the sensors can include an on-board camera configured to capture images that can be used to represent the warehouse or other surroundings.

In the simulation mode, a trainee can enter the vehicle 102 and access one or more training scenarios via the simulation controller 112. The trainee can receive instructions from the simulation controller 112 regarding how to operate the vehicle 102 and can be placed within an environment of the vehicle 102. The trainee can then actuate one or more of the plurality of controls 106 and the simulation controller 112 can respond by simulating the corresponding desired manipulation in the simulated environment.

Visual feedback can be provided to the trainee via the simulation display 114. In some non-limiting examples, the simulation display 114 may be in the form of virtual reality goggles worn by an operator. In some non-limiting examples, the simulation display 114 may be in the form of a computer monitor or TV placed in the trainee's field of view. In some non-limiting examples, the simulation display 114 may be in the form of an optical head-mounted display designed in the shape of a pair of eyeglasses. In this non-limiting example, camera angle and position within the simulated environment can change based on the position of the trainee's head during the simulation. Alternatively or additionally, the position of the trainee's body may be tracked and incorporated into the simulated environment based on feedback from the performance capture device 200. For example, the trainee's posture may be monitored throughout a training exercise for ergonomic analysis, and/ or the trainee may be picking up a load with their arms and the performance capture device 200 may detect when they extend for a simulated load within the simulated environment. Alternatively or additionally, the performance capture device 200 may be utilized to determine if a trainee keeps their body inside the vehicle 102 during a simulated training exercise. Auditory and/or tactile feedback can be provided, for example, by speakers connected to the simulation controller 112, via headphones worn by the trainee, and/or may be integrated into the virtual reality goggles or the display.

In one non-limiting example, the simulation controller 112 can be in communication with an external controller, or server, to track and store a trainee's progress. Additionally or alternatively, simulator training hours and which lessons, or simulation tasks, have been attempted or passed can be stored for each trainee. In some non-limiting examples, the external controller, or server, can notify a supervisor or trainer when a trainee has met a predefined level of training. In some non-limiting examples, a trainee profile can be stored and the performance of the vehicle 102 can be automatically updated to correspond to the level of training completion or experience indicated by the trainee profile. For example, when the trainee logs into the vehicle 102 in the standard mode, the trainee's profile may be read and the performance of the vehicle 102 may be modified to correspond with a level of the trainee's training experience.

Figure 10:
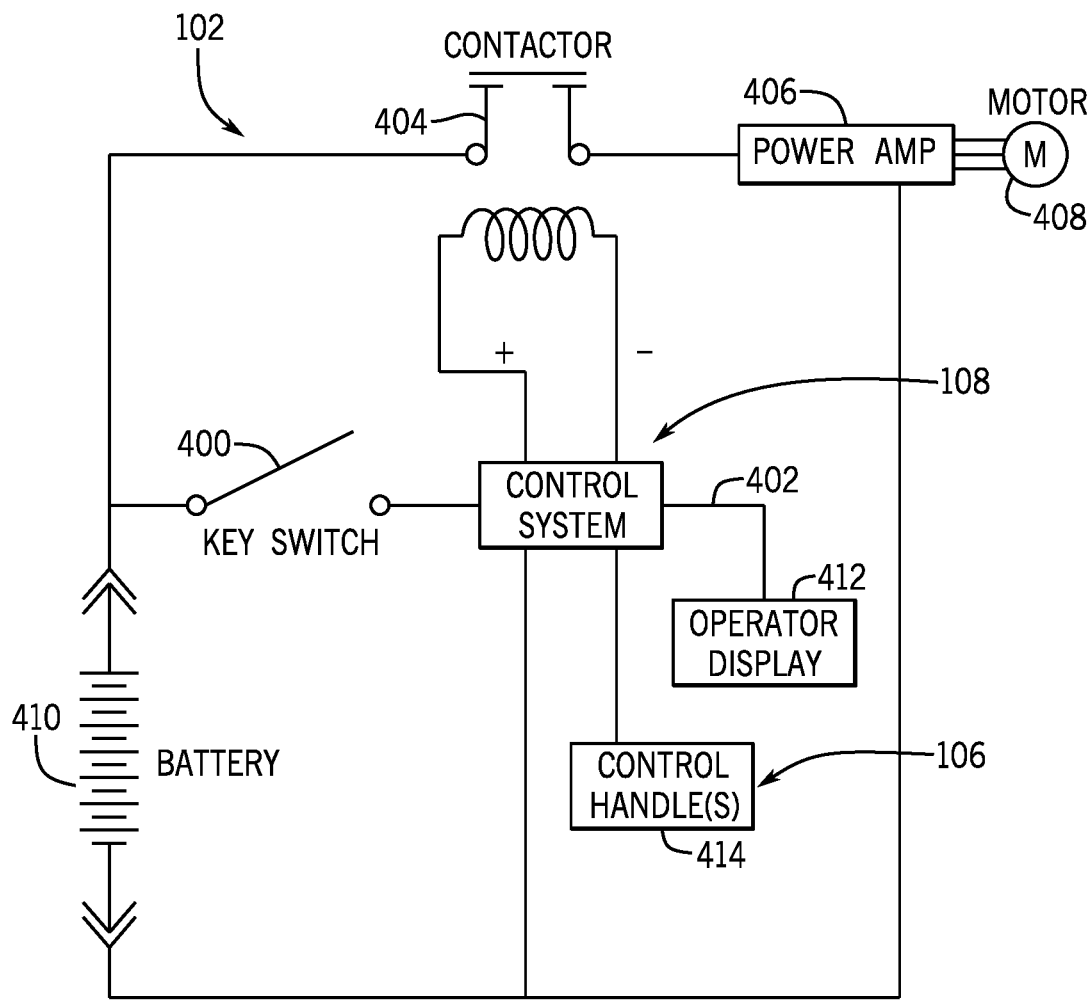
FIG. 10 is a schematic illustration of circuitry within a vehicle according to another aspect of the present disclosure.

FIG. 10 shows one non-limiting example of a schematic for use with the vehicle simulation system 100. In existing circuitry of the vehicle 102 (e.g., a material handling vehicle), a key switch 400 can removably connect a battery 410 to a control system 402. The control system 402 can be connected to an operator display 412 and one or more control handle(s) 414. The one or more control handle(s) 414 may be included in the plurality of controls 106. A contactor 404 can be connected to the battery 410, as well as a power amplifier 406. The power amplifier 406 can be connected to a motor 408. In some non-limiting examples, the vehicle controller 108 can be configured to operate as the control system 402. In another non-limiting example, the vehicle controller 108 can be independent from the control system 402.

In operation, the key switch 400 can send a signal to the control system 402 when the key switch 400 is in, or switched to, an "on" position. The control system 402 can then close the contactor 404, which energizes the power amplifier 406. When the control handle(s) 414 is manipulated, the control system 402 can receive a control signal. The control system 402 can then signal the power amplifier 406 to deliver power from the battery 410 to activate the motor 408. Software within the control system 402 can detect if the vehicle 102 is in simulation mode or the standard mode. When the vehicle 102 is in the simulation mode, the control system 402 can prevent the contactor 404 from closing (i.e., the control system 402 may retain the contactor 404 in an open state), thus inhibiting movement of the vehicle 102. The control system 402 can further control the operator display 412.

Figure 11:
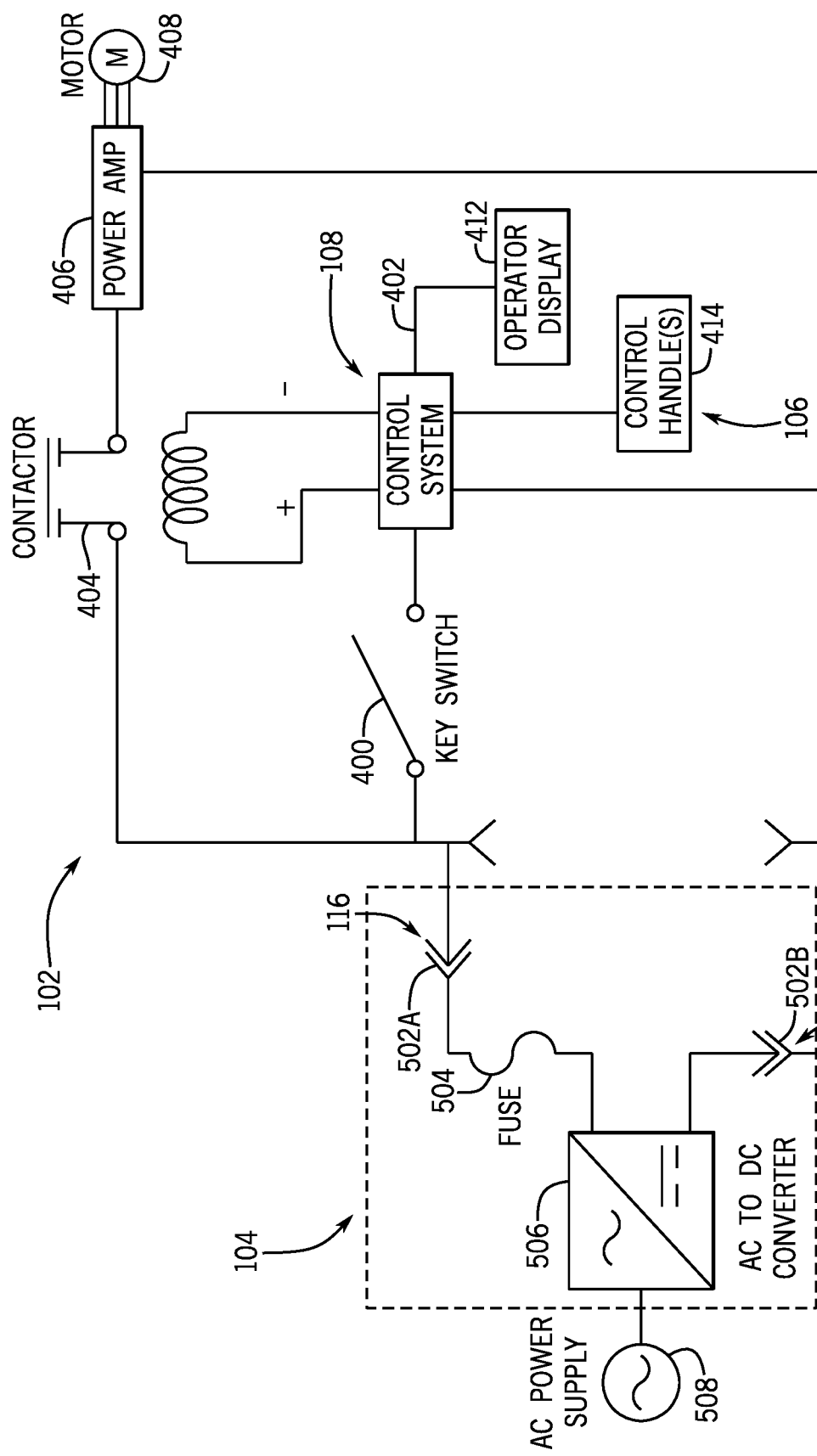
FIG. 11 is a schematic of a vehicle simulation system integrated into the circuity of FIG. 10 according to one aspect of the present disclosure.

As previously stated, in some non-limiting examples, it may be beneficial to include a simulation port 116. FIG. 11 illustrates one non-limiting of the interaction of a simulation port 116 with the schematic of FIG. 10. The connection of the simulation kit 104 to the simulation port 116 can allow for the battery 410 to be disconnected when the vehicle 102 is in the simulation mode, thereby inhibiting movement of the vehicle 102. The simulation port 116 can facilitate the connection of an AC to DC converter 506 to the control system 402, the plurality of controls 106, the display 412, and/or the plurality of sensors 110. The AC to DC converter 506 may be configured to receive input power from an AC power supply 508. An inline fuse 504 can be connected to the AC to DC converter 506. The simulation kit 104 can be removably connected to the simulation port 116 on the vehicle 102 via connections 502A, 502B. In the illustrated non-limiting example, the AC to DC converter 506 may be integrated into the simulation kit 104. In one non-limiting example, the AC to DC converter 506 can be located on-board the vehicle 102. In one non-limiting example, a DC source can be connected through the connection to the simulation port 116 to power the vehicle controller 108.

Still referring to FIG. 11, in some non-limiting examples, the AC power supply 508 may supply enough current to power the control system 402, the operator display 412, the plurality of controls 106, and the plurality of sensors 110. However, the AC power supply 508 may not supply current high enough to drive the motor 408. Should the motor 408 draw the current necessary to begin turning, the inline fuse 504 can be configured such that the inline fuse 504 trips, opening the circuit, and therefore preventing the motor 408 from turning. In some embodiments, the simulation port 116 can enable operation in simulation mode, even with the battery 410 disconnected. In this way, the simulation port 116 can provide further assurance that the motor 408 cannot operate during a simulation. As a further benefit, the vehicle 102 can be used in simulation mode for extended periods of time without impacting the vehicle's 102 battery life.

In some implementations, when an operator wants to use the vehicle 102 in simulation mode, the operator can disconnect the battery 410 and connect the simulation kit 104 to the simulation port 116 and thereby to the control system 402. In one non-limiting example, the operator can alternatively put the vehicle 102 in simulation mode by activating an emergency power off (EPO) switch and connecting the simulation kit 104 to the simulation port 116 and thereby to the control system 402. The AC to DC converter 506 can supply power from the AC power supply 508 to desired areas of the vehicle 102, which allows the control system 402 to pass outputs from the plurality of controls 106 and the plurality of sensors 110 to the simulation kit 104 via the simulation port 116. The simulation can then be controlled by the operator's manipulation of the vehicle controls.

Figure 12:
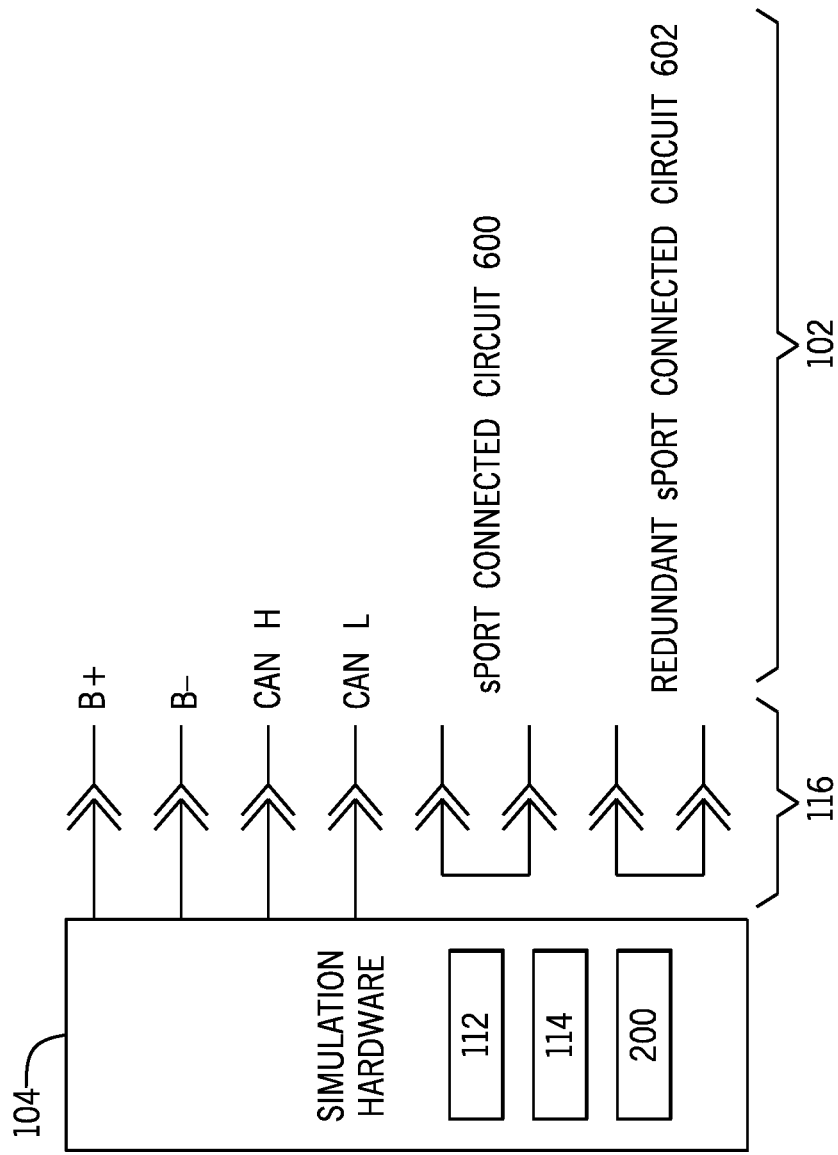
FIG. 12 is a pinout diagram for a vehicle simulation system including a simulation port according to one aspect of the present disclosure.

FIG. 12 shows one non-limiting example of a pinout configuration for the simulation port 116. In the illustrated non-limiting example. the simulation port 116 can have eight pins and/or sockets. In other non-limiting examples, the simulation port 116 can have more or less than eight pins and/or sockets. The simulation port 116 can facilitate the connection of the simulation kit 104 to the control system 402 of the vehicle 102. The simulation port 116 may be in communication with the CAN bus on the vehicle 102, which enables the signals carried thereon to be communication to the simulation kit 104 when connected to the simulation port 116. Power can be supplied to the control system 402 via additional pins, for example, by the B+ and B− pins.

A redundant circuit 602 can be provided within the simulation port 116. The redundant circuit 602 can help ensure that the vehicle 102 is in the intended mode (i.e., the simulation mode or the standard mode). In some non-limiting examples, the vehicle controller 108, or the control system 402, may be configured to confirm that both a primary circuit 600 and the redundant circuit 602 are opened and closed simultaneously, prior to instructing the vehicle to perform one of the standard operating tasks in the standard mode or the simulation mode.

Figure 13:
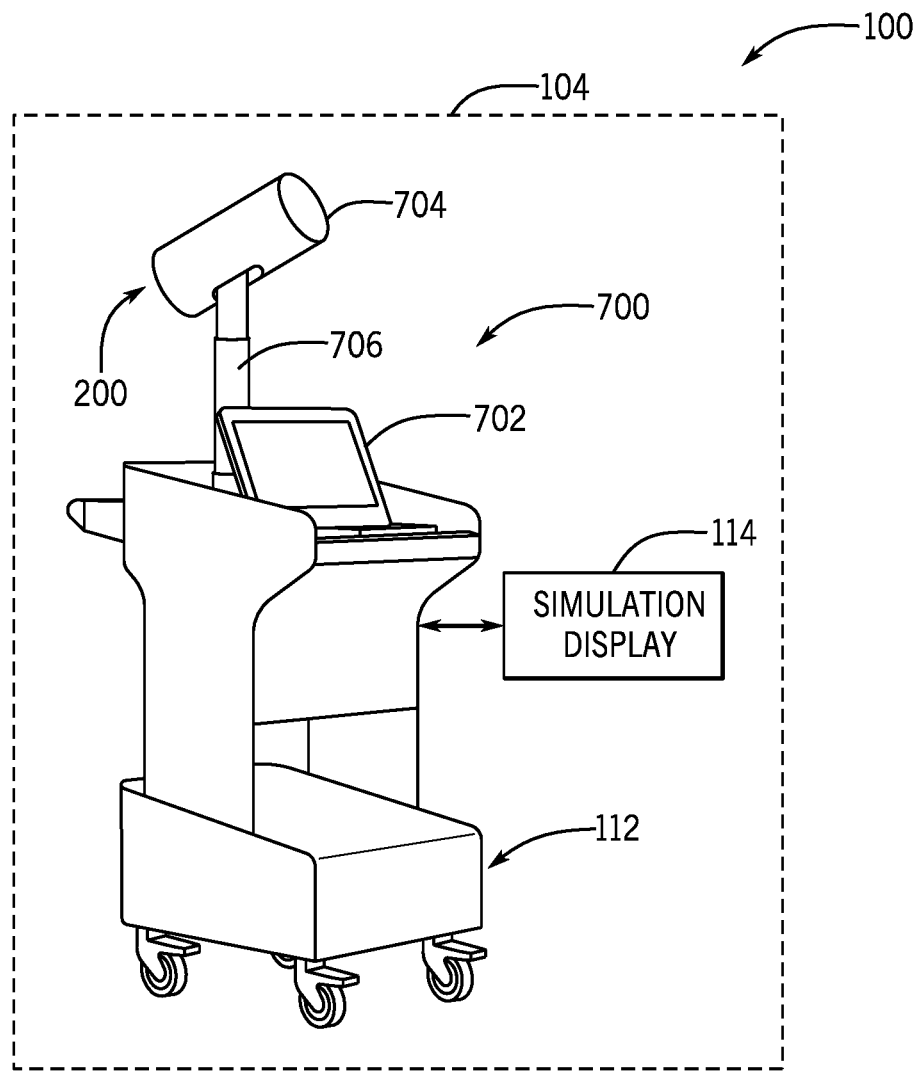
FIG. 13 is a top, front, left isometric view of a simulation kit including a simulation kiosk according to one aspect of the present disclosure.
Figure 14:
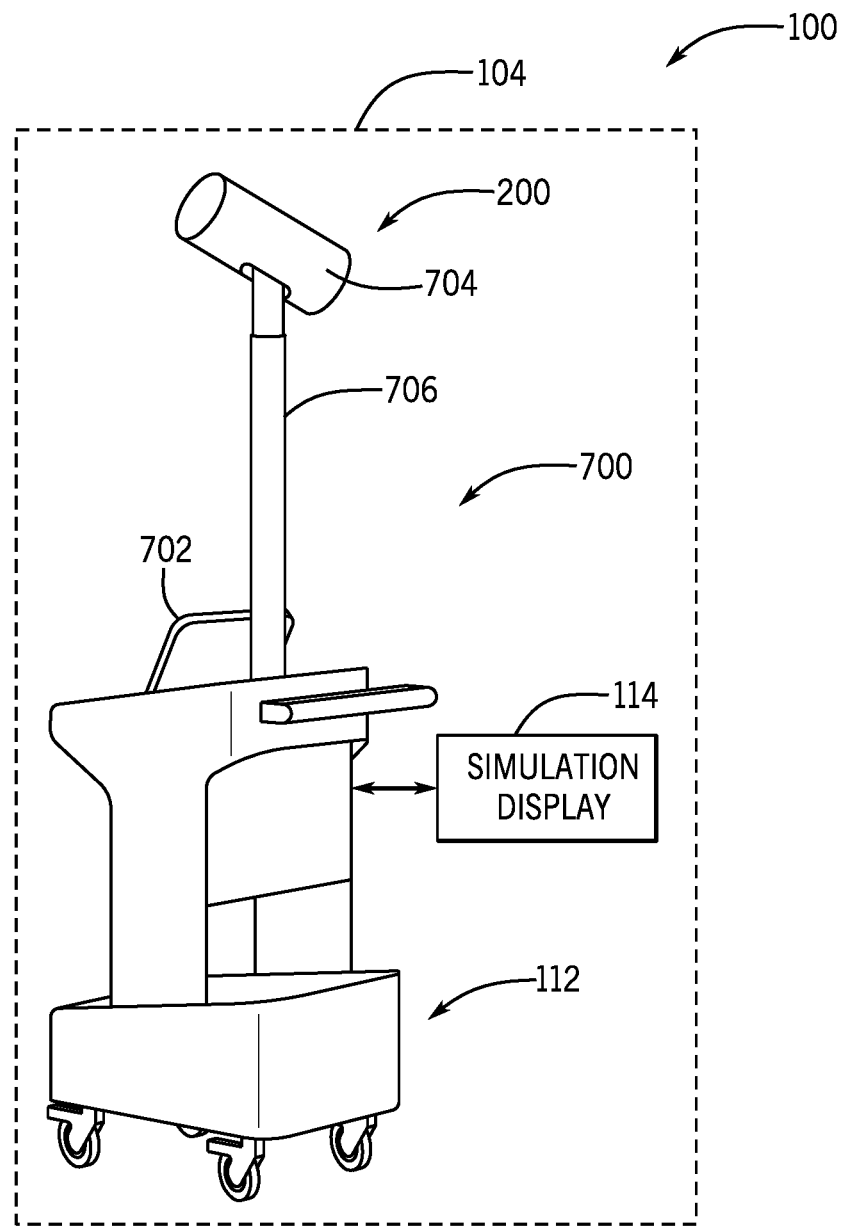
FIG. 14 is a top, back, right isometric view of the simulation kit of FIG. 13.

FIGS. 13 and 14 illustrate one non-limiting example of the simulation kit 104 according to the present disclosure. As shown in FIGS. 13 and 14, the simulation kit 104 may include a simulation kiosk 700 and the simulation display 114. The simulation controller 112 may be integrated into the simulation kiosk 700 and can be in communication with the simulation display 114. In some non-limiting examples, the simulation controller 112 may be in wired communication with the simulation display 114. In some non-limiting examples, the simulation controller 112 may be in wireless communication with the simulation display 114.

The simulation kiosk 700 can include the simulation controller 112, a kiosk display 702, and the performance capture device 200. In some non-limiting examples, the AC to DC converter 506 may be integrated into the simulation kiosk 700 and can be configured to receive AC power from the AC power supply 508 (e.g., wall power). The simulation display 114 may be duplicated onto the kiosk display 702 to enable a supervisor, or trainer, to monitor an operator during a simulation. In the illustrated non-limiting example, the simulation kiosk 700 may be mobile to enable it to be moved to a desired location adjacent to a vehicle that is going to be used for simulation. In other non-limiting examples, the simulation kiosk 700 may not be mobile and can be configured to interact wirelessly with one or more vehicles, for example, based on a unique vehicle identifier.

The performance capture device 200 may be attached to the simulation kiosk 700. In the illustrated non-limiting example, the performance capture device 200 may be in the form of an infrared sensor 704 movably attached to a post 706 that extends from the simulation kiosk 700. The infrared sensor 704 may be in communication with the simulation controller 112 and/or the simulation display 114 to enable the position of at least a portion of an operator to be monitored and recorded during a simulation. In other non-limiting examples, the performance capture device 200 may be in the form of a 3-D camera, a video camera, or another motion detecting device known in the art.

Figure 15:
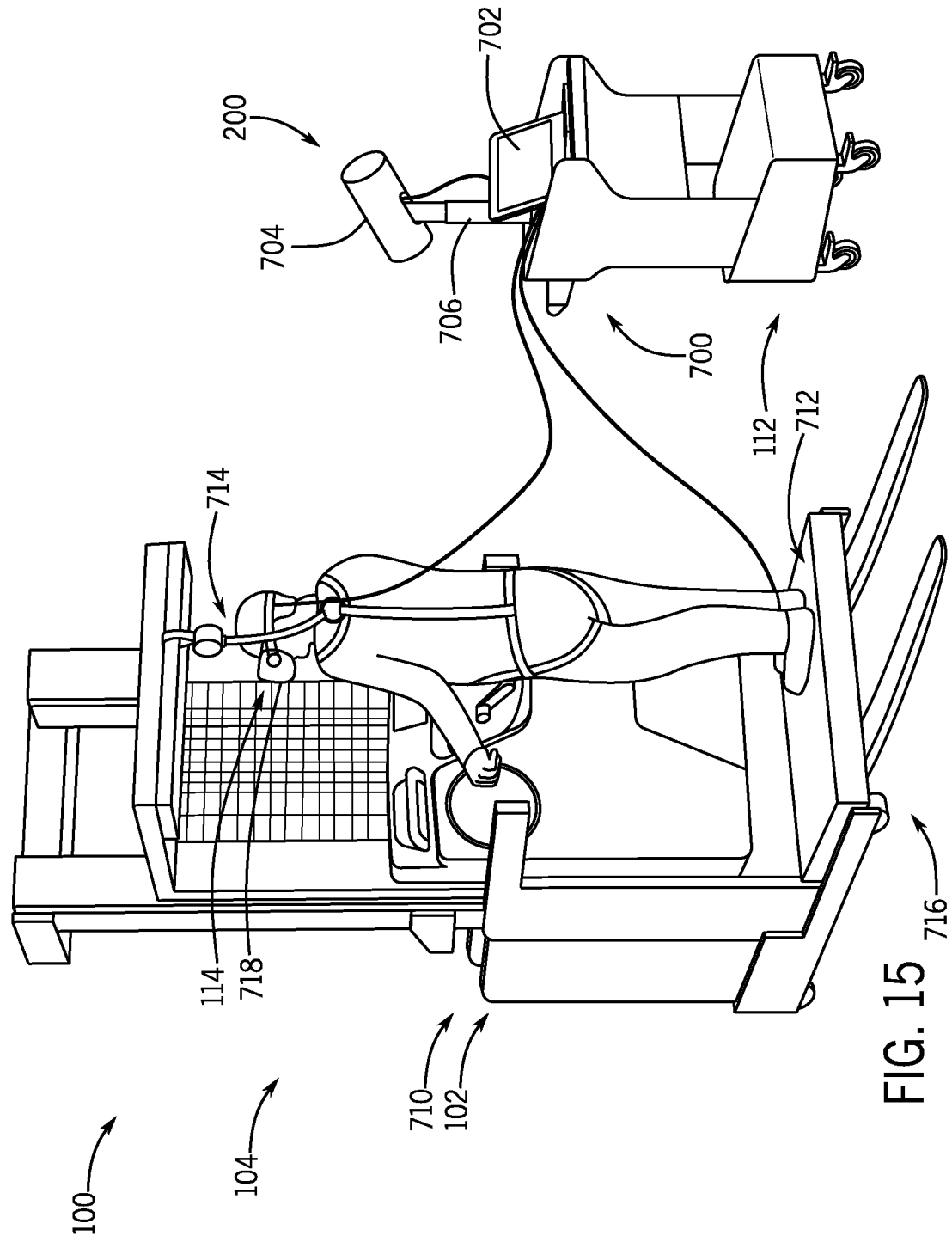
FIG. 15 illustrates an operator utilizing the simulation kit of FIG. 13 with a pair of virtual reality goggles according to one aspect of the present disclosure.

FIG. 15 illustrates one non-limiting example of the vehicle simulation system 100 in operation on a material handling vehicle. In the illustrated non-limiting example, the vehicle 102 may be in the form of a material handling vehicle 710 that is configured to manipulate a load, for example, within a warehouse. The material handling vehicle 710 includes the plurality of sensors 110, an operator compartment 712, a mast 714, and a fork assembly 716 moveably coupled to the mast 714. The operator compartment 712 can include the plurality of controls 106. An operator of the material handling vehicle 710 may be arranged within the operator compartment 712 during operation of the material handling vehicle 710. The plurality of controls 106 can enable the operator to control the operation of the material handling vehicle 710 (e.g., speed and steering of the material handling vehicle 710, height and position of the fork assembly 716, etc.) In some non-limiting examples, the operator compartment 712 may include one or more displays configured to provide operational data to the operator.

The mast 714 may be moveable in a vertical direction perpendicular to a surface on which the material handling vehicle 710 rests/travels. The movement of the mast 714 can alter the position of the fork assembly 716 to enable the operator to position the fork assembly 716 in a desired position (i.e., at a desired height).

The material handling vehicle 710 and the vehicle controller 108 arranged thereon are configurable between the standard mode and the simulation mode. In the standard mode, an operator may manipulate the plurality of controls 106 to perform a desired task using the material handling vehicle 710. Alternatively or additionally, the material handling vehicle 710 may be autonomously guided without an operator. In some non-limiting examples, the material handling vehicle 710 includes the simulation port 116 arranged thereon. When it is desired to transition to the simulation mode, the simulation kiosk 700 may be utilized to connect the simulation controller 112 to the vehicle controller 108 via the simulation port 116. Once a connection is made to the simulation port 116, the vehicle controller 108 may detect this connection and transition the material handling vehicle 710 to the simulation mode. In the simulation mode, the material handling vehicle 710 may be inhibited from traveling along a surface, but the vehicle controller 108 may communicate inputs from the plurality of controls 106 and the plurality of sensors 110 to the simulation controller 112. In this way, the operator may still manipulate the plurality of controls 106 and the intended operation of the material handling vehicle 710 may be simulated on the simulation controller 112 and displayed by the simulation display 114.

Figure 16:
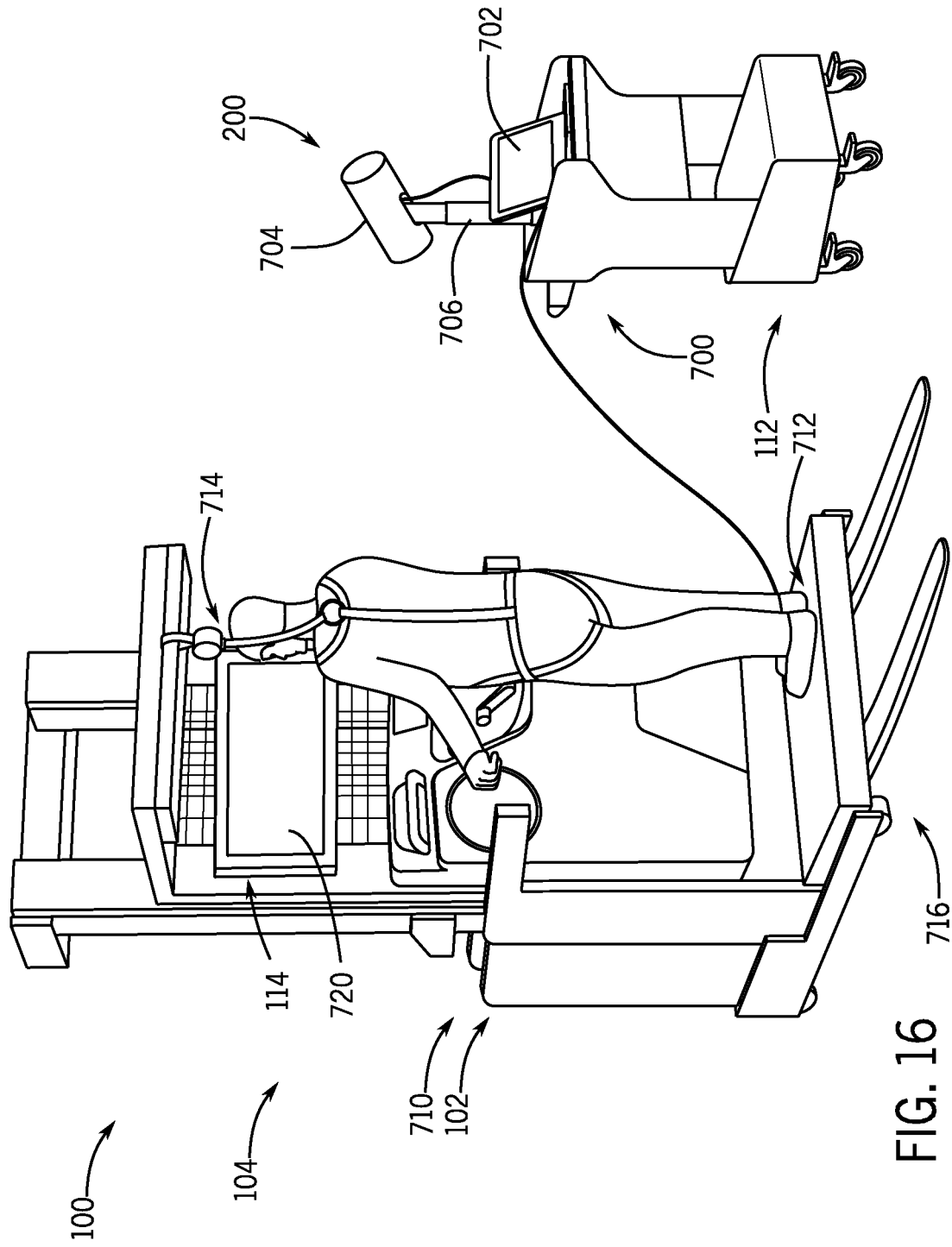
FIG. 16 illustrates of an operator utilizing the simulation kit of FIG. 13 with a monitor according to one aspect of the present disclosure.

In the illustrated non-limiting example, the simulation display 114 may be in the form of virtual reality goggles 718 configured to be worn by an operator. In another non-limiting example, as shown in FIG. 16, the simulation display 114 may be in the form of a monitor 720 in the field of view of the operator. In any case, once the vehicle controller 108 transitions the material handling vehicle 710 to the simulation mode, the simulation controller 112 may generate a simulated virtual reality environment that is projected onto the simulation display 114 and responsive to the outputs from the plurality of controls 106 and the plurality of sensors 110. In this way, the vehicle simulation system 100 can provide an interactive simulation environment that is operable on an actual material handling vehicle.

Figure 17:
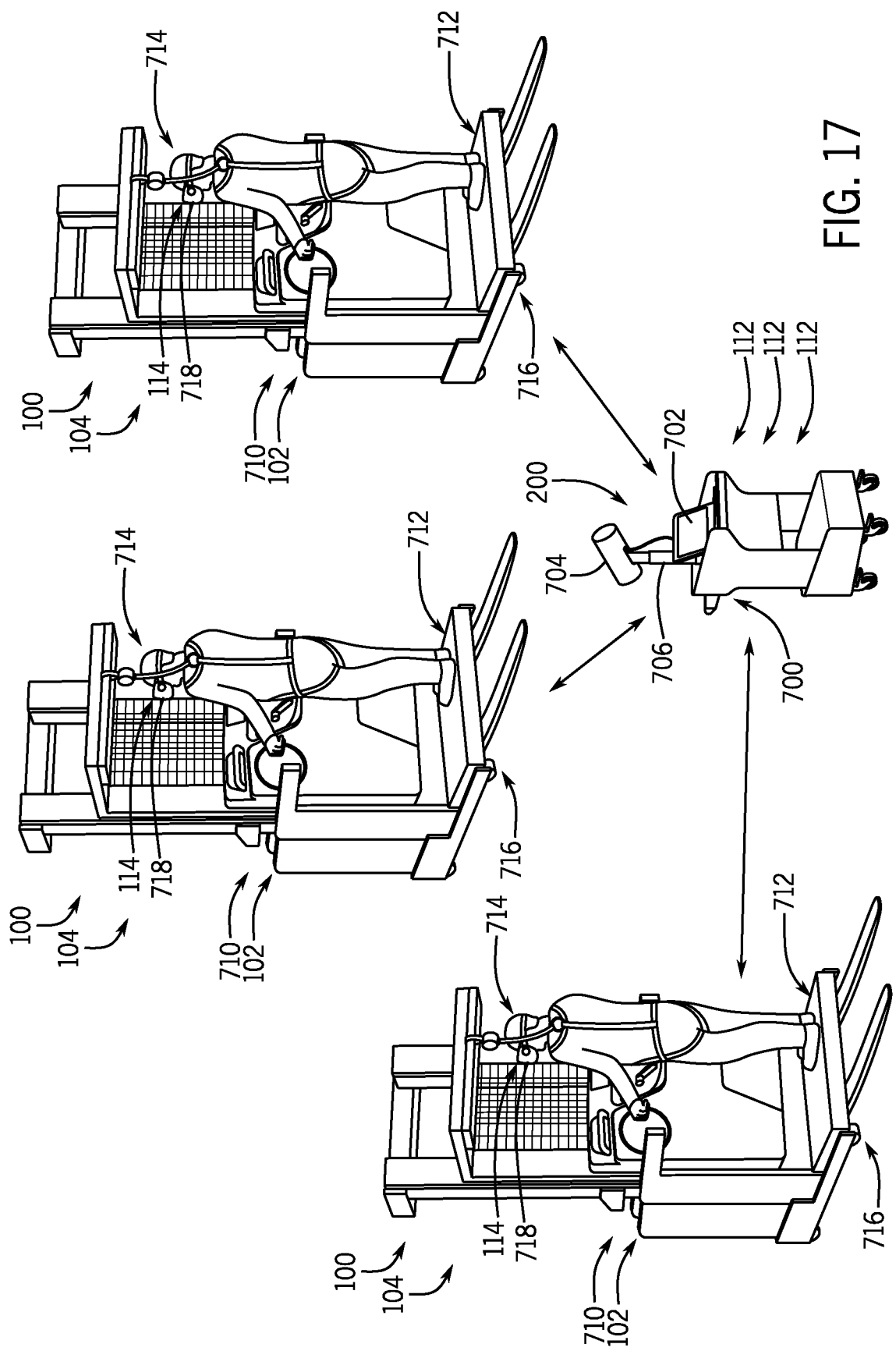
FIG. 17 illustrates a simulation kit including a plurality of simulation controllers in communication with a plurality of material handling vehicles according to one aspect of the present disclosure.
Figure 18:
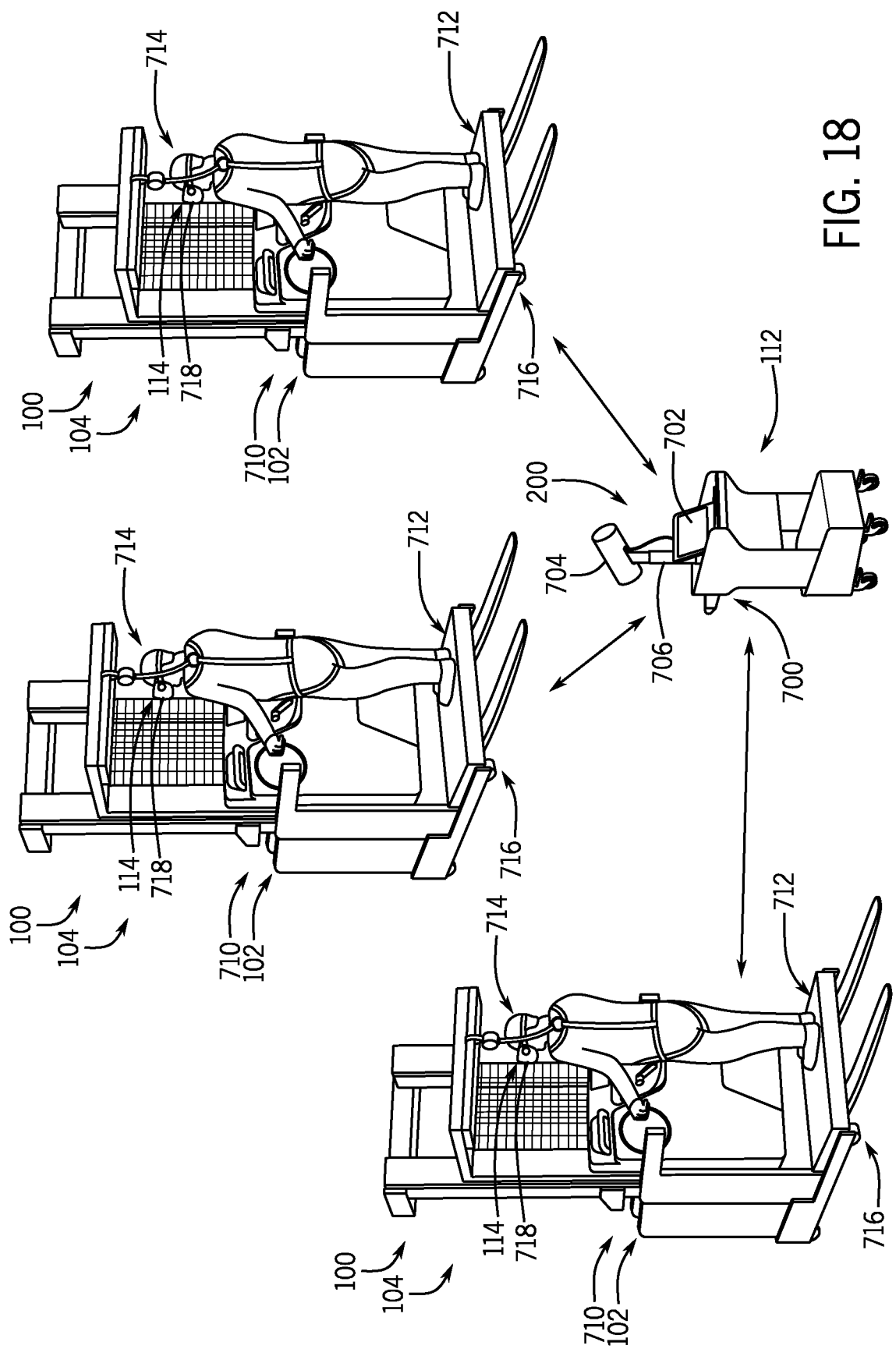
FIG. 18 illustrates a simulation kit including a simulation controller in communication with a plurality of material handling vehicles according to one aspect of the present disclosure.

It should be appreciated that the simulation kit 104 is not limited to interact with a single vehicle 102. For example, the simulation kiosk 700 may be include multiple simulation controllers 112 arranged thereon to enable the connection to a plurality of material handling vehicles 710, as illustrated in FIG. 17. Alternatively or additionally, the simulation controller 112 on the simulation kiosk 700 may be configured to run a plurality of simulation applications, each application supporting a corresponding material handling vehicle 710 having a simulation port 116, as shown in FIG. 18.

One non-limiting example of an operator performing a simulated task using the vehicle simulation system 100 will be described with reference to FIGS. 19A-28B. It should be appreciated that throughout the following operational description the figures with a "B" suffix illustrate what an operator, or trainee, may see in the simulated environment via the simulation display 114. The simulation display 114 may be reflected onto the kiosk display 702 to enable a trainer, or supervisor, to visualize how the operator performs during a simulated training exercise.

As illustrated in FIGS. 19A and 19B, the vehicle 102 may be in the form of the material handling vehicle 710. In the illustrated non-limiting example, the material handling vehicle 710 may be in the form of an orderpicker. It is to be appreciated that material handling vehicles are designed in a variety of configurations to perform a variety of tasks. Although the material handling vehicle 710 described herein is shown by way of example as an order picker, it will be apparent to those of skill in the art that the present invention is not limited to vehicles of this type, and can also be provided in various other types of MHV configurations, including for example, reach trucks, swing reach vehicles, pallet trucks, side loaders, counter balanced trucks, and any other material handling vehicles.

Initially, the material handling vehicle 710 may be operable in the standard mode and configured to perform any capable task that may be intended by an operator, or warehouse management system. To transition to the simulation mode, the simulation kit 104 may be implemented to interact with the material handling vehicle 710. Specifically, in the illustrated non-limiting example, the simulation kit 104 may include the simulation kiosk 700 and the virtual reality goggles 718. The simulation kiosk 700 may be transported to a location sufficient to enable interaction with the material handling vehicle 710. With the simulation kiosk 700 placed in a desired location, the simulation kiosk 700 may be placed in communication with the simulation port 116 on the material handling vehicle 710. In some non-limiting examples, the simulation kiosk 700 may include a connector configured to provide communication between the simulation port 116 and the simulation controller 112 on the simulation kiosk 700. In other non-limiting examples, the simulation controller 112 on the simulation kiosk 700 may be configured to wirelessly connect to the simulation port 116 on the material handling vehicle 710. In any case, once the simulation controller 112 is placed in communication with the simulation port 116, the simulation controller 112 may broadcast a message that is interpreted by the vehicle controller 108.

The vehicle controller 108 of the material handling vehicle 710 may respond to the message from the simulation controller 112 by displaying a message, for example, on a display (not shown) located in the operator compartment 712 requesting that the operator confirm that they want to place the vehicle into the simulation mode. Upon confirmation by the operator, the display (not shown) may prompt the operator to depress, or activate, the EPO switch on the material handling vehicle 710. Once the EPO switch is activated, the vehicle controller 108 may transition the material handling vehicle 710 from the standard mode to the simulation mode, and a message may be sent to the simulation controller 112 through the connection to the simulation port 116 indicating that the material handling vehicle 710 is now in the simulation mode. Alternatively, once the operator confirms that they want to place the material handling vehicle 710 in the simulation mode, the vehicle controller 108 may automatically open the contactor 404, and send a message to the simulation controller 112 indicating that the material handling vehicle 710 is now in the simulation mode.

In some non-limiting examples, the simulation kiosk 700 may be plug-and-play and, upon power-up, a message may be provided on the kiosk display 702 instructing a user to connect the simulation controller 112 on the simulation kiosk 700 to a material handling vehicle 710 having a simulation port 116. In some non-limiting examples, when the vehicle controller 108 provides a message to the simulation controller 112 confirming that the material handling vehicle 710 is in the simulation mode, the message may include information relating to the type and operational capabilities of the material handling vehicle 710. The simulation controller 112 may utilize this information to load a simulation application that is tailored to the type and functionality of the material handling vehicle 710.

As illustrated in FIG. 19B, the virtual reality goggles 718, and the kiosk display 702, may initially display a home screen of the simulation environment from which the operator, or trainee, may navigate through the simulated application generated by the simulation controller 112 and projected by the virtual reality goggles 718.

Once the material handling vehicle 710 is placed in the simulation mode, an operator, or trainee, may board the operator compartment 712 and put on the virtual reality goggles 718 to view the simulated application, as shown in FIGS. 20A and 20B. Initially, as shown in FIG. 20B, the simulated application may present a graphical user interface (GUI) to the operator providing them with a plurality of options from which to choose for different simulated tasks, or training exercises. In some non-limiting examples, the operator may utilize the plurality of controls 106 on the material handling vehicle 710 to act as a mouse and/or keyboard to enable the operator to navigate the GUI. In some non-limiting examples, a supervisor, or trainer, may be located at the simulation kiosk 700 and can navigate through the GUI for the operator.

The operator and/or the trainer may navigate through the GUI and select a desired training exercise for the operator to simulate on the material handling vehicle 710. In the illustrated non-limiting example, the operator may navigate to a main menu from the home screen in the simulated application. The main menu may include options, such as, an acclimation area, vehicle tutorial, practice environment, lessons, and/or feedback. In the acclimation area, for example, the simulated application may provide an environment for an operator, or trainee, to become acclimated to the simulated environment. The vehicle tutorial may provide the operator a simulated tour of a simulated version of the material handling vehicle 710 to enable the operator to become familiar with the operation and functionality thereof. In some non-limiting examples, the vehicle controller 108 may communicate the operational capabilities and type of the material handling vehicle 710 to the simulation controller 112 and, in response, the simulation controller 112 may load simulated applications specific to that vehicle. The practice environment may provide an operator, or a trainee, an environment in which to continually practice various simulated exercises without a set schedule or task to complete.

The lessons may provide the operator with a list of available simulated training exercises, or groups of simulated training exercises to perform in a simulated environment. The feedback option may provide an area for the operator, or trainee, to track their performance and/or an area for a trainer to grade the trainee as they perform a simulated training exercise or after they perform a simulated training exercise.

Figure 21B:
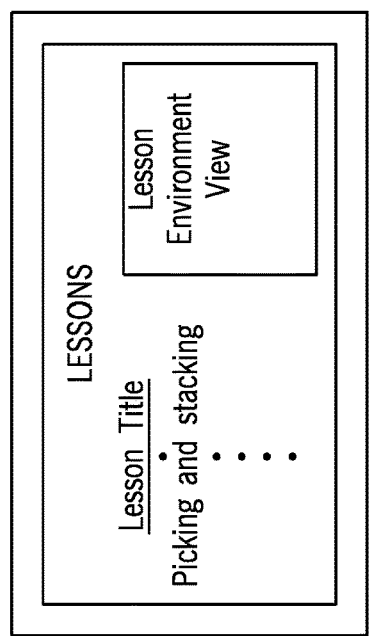
FIG. 21B illustrates a lessons screen projected in a simulated environment of the simulation kit of FIG. 13.
Figure 21A:
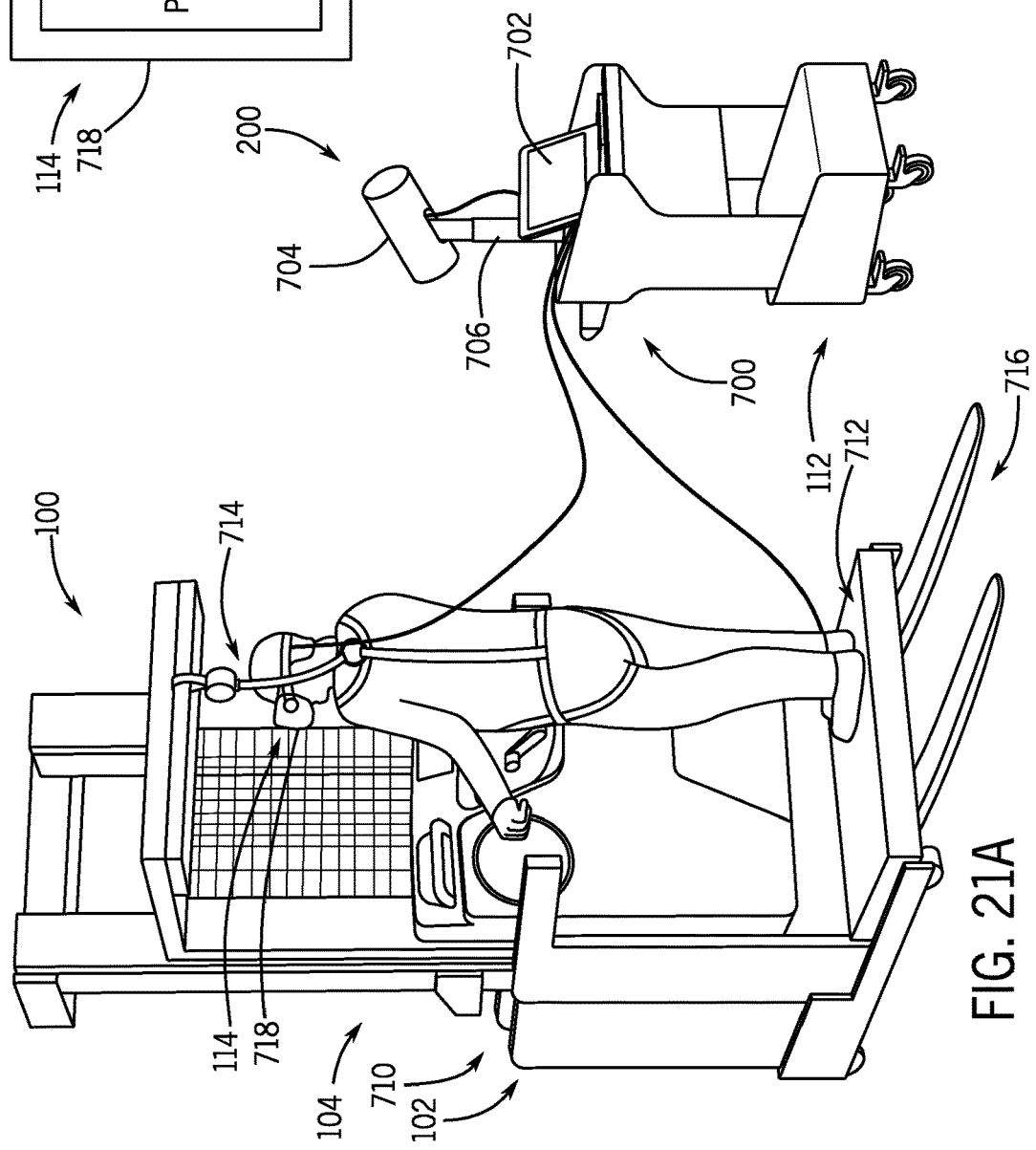
FIG. 21A illustrates an operator utilizing the simulation kit of FIG. 13 to navigate through available simulated lessons.
Figures 26A, 26B:
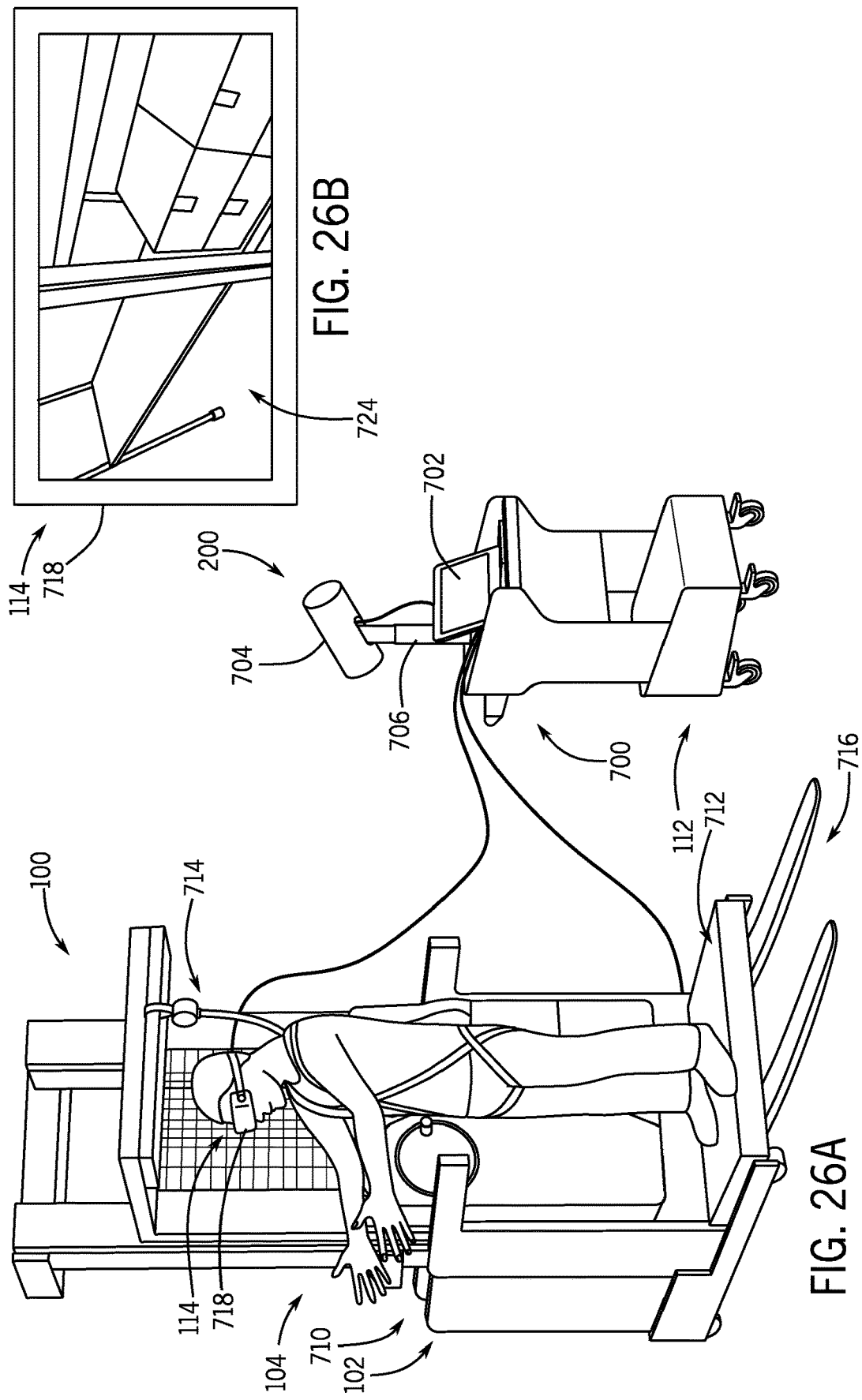
FIG. 26A illustrates an operator on a material handling vehicle picking a simulated desired load that is generated in a simulated environment of the simulation kit of FIG. 13.
FIG. 26B illustrates a simulated view of an operator picking a simulated desired load on a simulated racking structure projected by the simulation kit of FIG. 13.

As shown in FIGS. 21A and 21B, the operator and/or the trainer may select from a list of available lessons each corresponding with one or more simulated training exercises available to that operator and/or that are specific to the type and capabilities of the material handling vehicle 710. In some non-limiting examples, the GUI may provide the operator and/or the trainer with a lesson title and description of the training exercises. In some non-limiting examples, a lesson environment view of the simulated physical environment in which the training exercise takes place may be provided in the GUI. For example, the simulated physical environment may be a warehouse environment having one or more racking structures arranged therein with a plurality of loads/pallets arranged on the racking structures. In some non-limiting examples, the simulated physical environment may be recorded using one or more cameras (not shown) located on the material handling vehicle 710 during standard operation. In this way, the camera recordings can be used to create an accurate simulated representation of the warehouse. In addition, the simulated representation of the warehouse may be configured to reflect traffic changes, for example, due to seasonalities in the warehouse.

In the illustrated non-limiting example, the operator and/or the trainer may select a simulated pallet picking and stacking exercise. As shown in FIGS. 22A and 22B, once the desired training exercise is selected, the virtual reality goggles 718 may display the simulated physical environment to the operator and reflect the operators view onto the kiosk display 702 for visualization by the trainer. In the illustrated non-limiting example, as shown in FIG. 22B, the virtual reality goggles 718 may project a simulated physical warehouse and a simulated physical version of the material handling vehicle 710 to the operator. The position and orientation of the operator in the simulated material handling vehicle may correlate with the operator's position and orientation in real life. That is, the operator's physical movements (e.g., turning their head) may be reflected in the simulated environment. In addition, the simulation controller 112 may be configured to adapt the simulated environment in response to manipulation of the plurality of controls 106 on the material handling vehicle 710. That is, manipulation of the plurality of controls 106 on the material handling vehicle 710 may be reflected in the simulated environment on the simulated material handling vehicle. For example, if the operator instructs the material handling vehicle 710 to travel, the simulated material handling vehicle may travel in a direction and speed in the simulated warehouse corresponding to the input by the operator. As described above, in the simulation mode, the material handling vehicle 710 may be prevented from traveling in the real life, but the output resulting from manipulation of the corresponding vehicle controls 106 by the operator may be communicated from the vehicle controller 108 to the simulation controller 112 via the simulation port 116.

With continued reference to FIGS. 22A and 22B, initially in the simulated pallet picking and stacking exercise, the operator may be instructed to locate, pick, and stack a desired load 722 in a predetermined location within the simulated warehouse. The location of the desired load 722 may be highlighted within the simulated warehouse. Thus, the operator may manipulate the plurality of controls 106 on the material handling vehicle 710 to simulate travel within the simulated warehouse on the simulated material handling vehicle and/or change the simulated height of the fork assembly 716 on the simulated material handling vehicle.

Turning to FIGS. 23A-24B, as the operator approaches the desired load 722 in the simulated warehouse, which is located on a simulated racking structure 724, the operator may turn their head to visualize the desired load 722 and the projection of the simulated environment on the virtual reality goggles 718 may rotate a similar amount and/or adjust accordingly. In the illustrated non-limiting examples, the infrared sensor 704 may be used to track the position and orientation of the operator during the simulated training exercise, and to communicate these measurements to the simulation controller 112. The simulation controller 112 may be configured to vary the field of view projected to the operator within the simulated environment based on the measurements from the infrared sensor 704. Alternatively or additionally, the simulation controller 112 may be configured to track the orientation and position of the operator's hands and body via the measurements from the infrared sensor 704 and/or another performance capture device 200. In this way, the simulation controller 112 may be configured to determine recommended ergonomics for the operator and/or determine if the operator maintains their body and hands within the material handling vehicle 710 during the simulated training exercise.

As shown in FIGS. 25A-26B, once the operator reaches a position in the simulated warehouse that enables them to pick the desired load 722, the operator may reach out in real life to simulate picking the desired load 722. The performance capture device 200 may track the position and orientation of the operator's hands and, in response, the simulation controller 112 may detect that the operator's virtual hands have picked that desired load 722. In response to the simulation controller 112 detecting that the operator picked the simulated desired load 722, the simulation controller 112 may remove the simulated desired load 722 from the simulated racking structure 724, as shown in FIG. 24B.

Figure 28B:
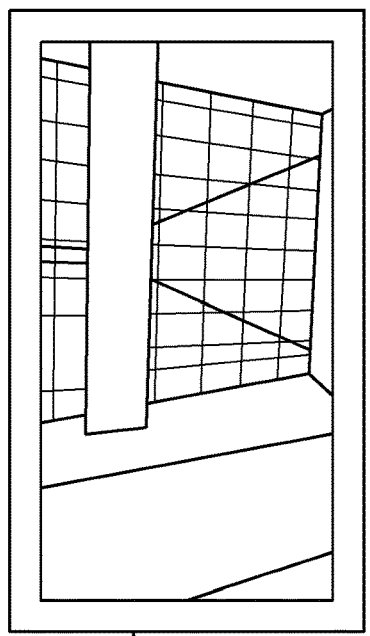
FIG. 28B illustrates a simulated view of an operator continuing to travel on a material handling vehicle projected by the simulation kit of FIG. 13.
Figure 28A:
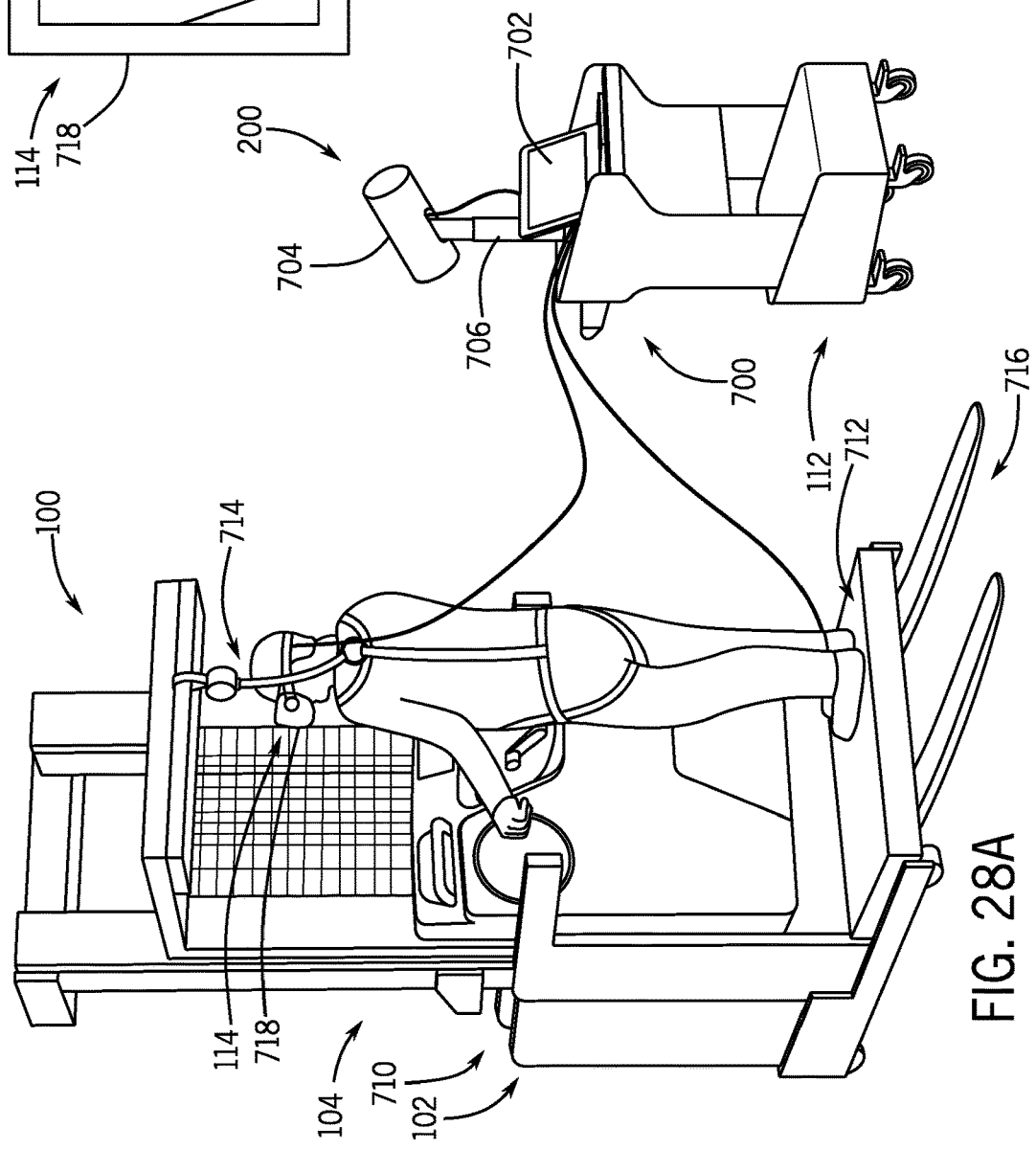
FIG. 28A illustrates an operator continuing to manipulate a material handling vehicle to travel through a simulated environment of the simulation kit of FIG. 13.

Turning to FIGS. 27A and 27B, once the simulated desired load 722 is removed from the simulated racking structure 724, the operator may again rotate their body and hands in real life to simulate placing the picked desired load 722 on the fork assembly 716 of the material handling vehicle 710. The simulation controller 112 may detect this movement, via the performance capture device 200 and, in response, simulate the operator's virtual hands placing the picked desired load 722 on the simulated fork assembly of the simulated material handling vehicle within the simulated environment. With the simulated desired load 722 placed on the simulated fork assembly, the operator may turn to resume travel through the simulated warehouse by manipulating the plurality of controls 106 on the material handling vehicle 710, as shown in FIGS. 28A and 28B.

It should be appreciated that a simulated picking and stacking exercise is but one non-limiting example of a training exercise that may be simulated by the vehicle simulation system 100. For example, in other non-limiting examples, the vehicle simulation system 100 may be configured to simulate entering and exiting aisles, use of a guidance system such as wire guidance or rail guidance, operating the vehicle around pedestrian and/or other vehicle traffic, operating the vehicle around overhead obstructions, handling custom loads and/or fixtures and/or attachments, operating the vehicle on a ramp, and interaction with various racking configurations such as standard racking, double-deep racking, push-back racking, drive-in racking, and racking with a radio shuttle, to name a few.

In some non-limiting examples, the simulated warehouse in which the simulated material handling vehicle operates may be accurately modeled, for example, with specific SKU locations accurately represented therein. This may enable the operator, or trainee, to conduct simulated training modules that are site specific and/or SKU specific. In some non-limiting examples, the simulation controller 112 may be in communication with a warehouse management system that is used to track performance data for a fleet of material handling vehicles. This may enable a picklist or vehicle scheduling to be imported into the simulation controller 112 so that the operator, or trainee, may experience a simulated typical work day. The trainee's simulated performance may be compared to the pick rate (or any other key performance indicators) of other operators who conduct work in the real warehouse. This capability may allow trainers, or supervisors, to train operators for very specific use cases that will capture seasonal changes. In addition, this integration of data may enable the use of real performance indicators to assess how a trainee compares to an experienced operator.

In some non-limiting examples, the simulation display 114 may include a camera arranged thereon that may be configured to track operator hand movements and communicate these movements to the simulation controller 112. In this way, the simulation controller 112 may track, for example, if the trainee uses their hands to wave on other vehicles that have the right-of-way in the simulated environment. Additionally or alternatively, the simulation controller 112 may be configured to simulate multiple operators, or trainees, in the same simulated environment. In this way, the trainees may gain experience with manipulating a simulated material handling vehicle in an environment with other vehicles being operated.

Thus, the techniques and properties of the vehicle simulation system 100 of the present disclosure can enable a trainee to train on an actual operable vehicle while visualizing a simulated environment. Specifically, the vehicle simulation system 100 can enable the vehicle 102 to transition from a standard mode, where standard operating tasks can be performed, to a simulation mode where a trainee can train on a fully realistic vehicle simulator to complement actual vehicle operation. This can enable the benefits of having a dedicated simulator, such as having representative controls, being able to train operators, and giving consistent feedback that can be documented. Additionally, the vehicle simulation system 100 can eliminate the need for users to purchase a non-operational dedicated simulator, as the simulation kit 104 can be removed from the vehicle 102 and the vehicle 102 can return to performing standard operating tasks in the standard mode thereby increasing utilization of the vehicle 102. Further, the vehicle simulation system 100 can provide advantages over training personnel on actual trucks in that it will more easily facilitate a trainer to oversee the trainee during his or her training because the trainer can review the results of the training using the provided technology. Further still, trainees can be self-paced, resulting in more efficient training of operators, and the trainer can enable new scenarios where an instructor can give feedback while standing next to a stationary simulator where this could not be practical if the trainee were driving an actual vehicle. This can help trainees become proficient more efficiently.

Within this specification embodiments have been described in a way that enables a clear and concise specification to be written, but it is intended and will be appreciated that embodiments may be variously combined or separated without parting from the invention. For example, it will be appreciated that all preferred features described herein are applicable to all aspects of the invention described herein.

Thus, while the invention has been described in connection with particular embodiments and examples, the invention is not necessarily so limited, and that numerous other embodiments, examples, uses, modifications and departures from the embodiments, examples and uses are intended to be encompassed by the claims attached hereto. The entire disclosure of each patent and publication cited herein is incorporated by reference, as if each such patent or publication were individually incorporated by reference herein.

Various features and advantages of the invention are set forth in the following claims.

We claim:

1. A material handling vehicle simulation system comprising:
    a material handling vehicle including:
        a plurality of controls operable to manipulate the material handling vehicle to perform a desired operation; and
        a vehicle controller configured to selectively transition between a standard mode where the vehicle controller is configured to instruct the material handling vehicle to perform standard operating tasks and a simulation mode, wherein the vehicle controller is further configured to detect a triggering event to indicate when the vehicle controller is to transition between the standard mode and the simulation mode;
    a simulation port having one or more pins; and
    a simulation kit including:
        a simulation display; and
        a simulation controller in communication with the plurality of controls and the simulation display, wherein when the vehicle controller is in the simulation mode, the simulation controller is configured to simulate operation of the material handling vehicle on the simulation display in response to manipulation of at least one of the plurality of controls, and wherein the triggering event comprises connecting the simulation controller to the vehicle controller via the simulation port.

2. The material handling vehicle simulation system of claim 1, wherein the triggering event comprises actuating a switch.

3. The material handling vehicle simulation system of claim 1, wherein the triggering event comprises connecting the simulation controller to the vehicle controller followed by actuating a switch.

4. The material handling vehicle simulation system of claim 1, wherein the simulation kit further comprises a performance capture device in communication with the simulation controller and configured to monitor a position of at least a portion of an operator.

5. The material handling vehicle simulation system of claim 4, wherein the performance capture device is in the form of a camera.

6. The material handling vehicle simulation system of claim 4, wherein the performance capture device is in the form of an infrared sensor.

7. The material handling vehicle simulation system of claim 1, wherein the vehicle controller is configured to communicate output signals from the plurality of controls to the simulation controller.

8. The material handling vehicle simulation system of claim 1, wherein the material handling vehicle includes at least one component configured to provide haptic feedback to an operator, when the vehicle controller is in the simulation mode.

9. The material handling vehicle simulation system of claim 1, wherein the simulation display comprises virtual reality goggles.

10. The material handling vehicle simulation system of claim 1, wherein the simulation controller is configured to alter a camera angle and a simulated position displayed by virtual reality goggles based on a position of an operator, when the vehicle controller is in the simulation mode.

11. The material handling vehicle simulation system of claim 1, wherein the simulation controller is integrated into a simulation kiosk.

12. The material handling vehicle simulation system of claim 11, wherein the simulation kiosk includes a kiosk display configured to reflect the simulation display.

13. The material handling vehicle simulation system of claim 11, wherein the simulation kiosk includes a performance capture device in communication with the simulation controller and configured to monitor a position of at least a portion of an operator.

14. A simulation kit configured to interact with a material handling vehicle having a vehicle controller, a simulation port in communication with the vehicle controller, and a plurality of controls in communication with the vehicle controller, the simulation kit comprising:
    a simulation display;
    a performance capture device configured to monitor a position of at least a portion of an operator positioned within the material handling vehicle; and
    a simulation controller configured to connect to the vehicle controller via the simulation port, wherein when the simulation controller is connected to the simulation port via one or more pins in the simulation port, the simulation controller is configured to generate a simulated environment that is projected onto the simulation display, wherein the simulation controller is configured to adapt the simulated environment in response to manipulation of at least one of the plurality of controls, and wherein the connection between the vehicle controller and the simulation controller via the simulation port is configured to trigger the vehicle controller to transition to from a standard mode to a simulation mode.

15. The simulation kit of claim 14, wherein the performance capture device is in the form of a camera.

16. The simulation kit of claim 14, wherein the performance capture device is in the form of an infrared sensor.

17. The simulation kit of claim 14, wherein the simulation display comprises virtual reality goggles.

18. The simulation kit of claim 17, wherein the simulation controller is configured to alter a camera angle and a simulated position displayed by virtual reality goggles in the simulated environment based on a position of an operator monitored by the performance capture device.

19. The simulation kit of claim 14, wherein the simulation controller is integrated into a simulation kiosk.

20. The simulation kit of claim 19, wherein the simulation kiosk includes a kiosk display configured to reflect the simulation display.

21. The simulation kit of claim 19, wherein the performance capture device is coupled to the simulation kiosk.

22. A method for material handling vehicle simulation using a material handling vehicle, the material handling vehicle including a plurality of controls and a simulation port having one or more pins, wherein the material handling vehicle is operable in a standard mode where the material handling vehicle is configured to perform standard operating tasks and a simulation mode, the method comprising:
- connecting a simulation controller to the simulation port, the simulation controller in communication with a simulation display;
- upon connecting the simulation controller to the simulation port, triggering the material handling vehicle to transition from the standard mode to the simulation mode; and
- simulating operation of the material handling vehicle in a simulated environment on the simulation display in response to an operator manipulating at least one of the plurality of controls.

23. The method of claim 22, wherein triggering the material handling vehicle to transition from the standard mode to the simulation mode comprises:
- detecting the connection between the simulation controller and the simulation port on the material handling vehicle.

24. The method of claim 22, further comprising:
- providing a message from the simulation controller to a vehicle controller requesting confirmation that the material handling vehicle is to be placed into the simulation mode.

25. The method of claim 24, further comprising:
- indicating, in response to the provided message, that the material handling vehicle is to transition into the simulation mode; and
- upon indicating that the material handling vehicle is to transition to the simulation mode, transitioning the material handling vehicle from the standard mode to the simulation mode.

26. The method of claim 24, further comprising:
- communicating information relating to a type and operational capabilities of the material handling vehicle from the vehicle controller to the simulation controller.

* * * * *